(12) United States Patent
Tominaga et al.

(10) Patent No.: US 7,364,495 B2
(45) Date of Patent: Apr. 29, 2008

(54) WAFER DOUBLE-SIDE POLISHING APPARATUS AND DOUBLE-SIDE POLISHING METHOD

(75) Inventors: Hiroyoshi Tominaga, Fukushima (JP); Toshiyuki Hayashi, Gunma (JP)

(73) Assignee: Etsu Handotai Co., Ltd., Tokyo (JP)

(*) Notice: Subject to any disclaimer, the term of this patent is extended or adjusted under 35 U.S.C. 154(b) by 283 days.

(21) Appl. No.: 10/500,278

(22) PCT Filed: Mar. 26, 2003

(86) PCT No.: PCT/JP03/03743

§ 371 (c)(1),
(2), (4) Date: Jun. 29, 2004

(87) PCT Pub. No.: WO03/083917

PCT Pub. Date: Oct. 9, 2003

(65) Prior Publication Data

US 2005/0124264 A1 Jun. 9, 2005

(30) Foreign Application Priority Data

Mar. 28, 2002 (JP) ............................ 2002-091087
Mar. 28, 2002 (JP) ............................ 2002-091207

(51) Int. Cl.
*B24B 1/00* (2006.01)
*B24B 5/00* (2006.01)
(52) U.S. Cl. ..................... 451/41; 451/63; 451/268; 451/269
(58) Field of Classification Search ............ 451/262, 451/41, 53, 63, 268, 269
See application file for complete search history.

(56) References Cited

U.S. PATENT DOCUMENTS

| | | | | |
|---|---|---|---|---|
| 4,205,489 A | * | 6/1980 | Orlov et al. | 451/269 |
| 4,773,185 A | * | 9/1988 | Taira | 451/269 |
| 5,197,230 A | * | 3/1993 | Simpfendorfer et al. | 451/11 |
| 5,967,882 A | * | 10/1999 | Duescher | 451/57 |
| 6,080,048 A | * | 6/2000 | Kotagiri et al. | 451/285 |

(Continued)

FOREIGN PATENT DOCUMENTS

JP 04-217456 8/1992

(Continued)

*Primary Examiner*—Maurina Rachuba
(74) *Attorney, Agent, or Firm*—Oliff & Berridge, PLC

(57) ABSTRACT

The present invention provides a wafer double-side polishing apparatus comprising at least a carrier plate having wafer holding holes; upper and lower turn tables to which polishing pads are attached; and a slurry supply means; with wafers held in the wafer holding holes, the carrier plate being moved between the upper and lower turn tables while supplying slurry, to simultaneously polish both front and back surfaces of wafers, wherein a PCD of upper turn table load supporting points that is a diameter of a circle joining load supporting points of the upper turn table coincides with a PCD of centers of the wafer holding holes on the carrier plate that is a diameter of a circle joining each center of the wafer holding holes on the carrier plate. Thereby, there can be provided a wafer double-side polishing apparatus and method in which it is possible to control wafer shape by deforming turn tables with excellent responsiveness, and to polish the wafers stably with high precision without deteriorating wafer shape.

8 Claims, 10 Drawing Sheets

U.S. PATENT DOCUMENTS

| | | | |
|---|---|---|---|
| 6,361,418 B1 * | 3/2002 | Inada | 451/262 |
| 6,416,393 B2 * | 7/2002 | Fabry et al. | 451/41 |
| 6,454,635 B1 * | 9/2002 | Zhang et al. | 451/41 |
| 6,554,689 B2 * | 4/2003 | Ohkuma et al. | 451/262 |
| 2003/0181141 A1 * | 9/2003 | Taniguchi et al. | 451/36 |

FOREIGN PATENT DOCUMENTS

| | | |
|---|---|---|
| JP | A 7-111255 | 4/1995 |
| JP | 09-174418 | 7/1997 |
| JP | A 9-262759 | 10/1997 |
| JP | A 10-202511 | 8/1998 |
| JP | A 10-249717 | 9/1998 |
| JP | A 2001-30151 | 2/2001 |
| JP | A 2001-252864 | 9/2001 |
| JP | 2001-291690 | 10/2001 |
| JP | 2002-028852 | 1/2002 |
| JP | A 2002-46059 | 2/2002 |

* cited by examiner

WAFER DOUBLE-SIDE POLISHING APPARATUS AND DOUBLE-SIDE POLISHING METHOD

TECHNICAL FIELD

The present invention relates generally to a polishing apparatus and a polishing method capable of maintaining time-varying wafer quality stably during wafer polishing using a double-side polishing apparatus, and more particularly to a wafer double-side polishing apparatus and a double-side polishing method for polishing wafers while controlling wafer shape by controlling at least an upper turn table shape of the double-side polishing apparatus that polishes both front and back surfaces of wafers at the same time.

BACKGROUND ART

A silicon wafer manufacturing method will be described as an example of conventional wafer manufacturing method. Silicon single crystal ingots are first grown by the Czochralski method (CZ method), etc., and sliced into silicon wafers. Then those silicon wafers are subjected to chamfering, lapping and etching steps in succession, after which the wafers undergo a polishing step where at least the wafer main surface is mirror-polished.

In the wafer polishing step, a double-side polishing apparatus is used occasionally when both front and back surfaces of silicon wafers are polished. As the double-side polishing apparatus, a so-called four-way double-side polishing apparatus is normally employed that has a planetary gear construction in which carrier plates for holding wafers are arranged between a sun gear provided at the center portion and an internal gear provided at the perimeter portion.

The four-way double-side polishing apparatus can simultaneously polish both front and back surfaces of silicon wafers by inserting silicon wafers into and holding them in a plurality of carrier plates on which wafer holding holes are formed, pressing upper and lower turn tables, in which polishing pads are attached to wafer-facing surfaces, against front and back surfaces of each wafer and rotating the turn tables in relative directions while supplying polishing slurry from above the held silicon wafers and by concurrently rotating and revolving the carrier plates using the sun and internal gears.

A double-side polishing apparatus as described in Japanese Patent Laid-open (Kokai) Publication No. 10-202511 is among other known forms of double-side polishing apparatuses. FIG. 5 illustrates a schematic sectional view of the double-side polishing apparatus. A double-side polishing apparatus 41 comprises a carrier plate 46 with a plurality of wafer holding holes in which silicon wafers 44 are held, upper and lower turn tables 42 and 43 which are arranged above and below the carrier plate 46 and to whose wafer-facing surfaces polishing pads 45 are attached for simultaneously polishing both front and back surfaces of the silicon wafers 44 and carrier motion means (not shown) for moving the carrier plate 46 sandwiched between the upper and lower turn table 42 and 43 within a plane parallel to the front surface of the carrier plate 46. The upper turn table 42 is provided with a cylinder 47 for applying rotation and polishing loads, a housing 48 for transmitting those loads to the upper turn table 42 and fixing means 49 such as bolts for fixing the housing 48 and the upper turn table 42. On the other hand, the lower turn table 43 is provided with the cylinder 47 for imparting rotation from a motor and a speed reducer (not shown) to the lower turn table 43 and a thrust bearing 50 that supports the load of the turn tables.

In such the double-side polishing apparatus 41, the carrier plate 46, sandwiched between the upper and lower turn tables 42 and 43, is caused to make a circular motion not accompanied by its rotation by the carrier motion means (not shown) via a carrier holder 51, that is, a type of swinging motion in which the carrier plate 46 circles without rotating while remaining eccentric by a given distance from the rotational axis of the upper and lower turn tables 42 and 43. At this time, the silicon wafers 44 are held in the wafer holding holes of the carrier plate 46 so as to be rotatable, allowing the silicon wafers 44 to turn together (rotate) in the direction of rotation of the faster rotating turn table as a result of rotation of the upper and lower turn tables at different speeds or in different directions on the rotational axis.

Therefore, when both front and back surfaces of silicon wafers are polished, it is possible to simultaneously and uniformly polish both front and back surfaces of silicon wafers by inserting the silicon wafers into respective wafer holding holes on the carrier plate, holding the silicon wafers therein and causing the carrier plate to make a circular motion not accompanied by its rotation while causing the wafers themselves to rotate in the wafer holding holes by rotating the upper and lower turn tables at different speeds or in different directions, with slurry containing polishing abrasive grain supplied to the silicon wafers. Double-side polishing apparatuses in such a form have lately come into frequent use with recent increase in wafer diameter since the apparatuses are capable of double-side polishing of large-sized wafers with ease.

However, if a plurality of batches of wafers are polished repeatedly using a four-way double-side polishing apparatus as described above or double-side polishing apparatus that polish wafers by causing the carrier plate to make a circular motion not accompanied by its rotation, the polishing ability and other factors of polishing pads attached to the upper and lower turn tables change over time due to polishing pads' life, clogging and other factors. For this reason, polishing of a plurality of batches of wafers without replacement of the polishing pads has given rise to change in polished wafer shape over time with more polished batches, resulting in wafer shape differences between batches and problems that it is impossible to maintain wafer quality stably.

To solve the problems, wafers have traditionally been polished by changing various polishing conditions according to changes in polishing ability of the polishing pads and other factors over time, thereby controlling change in wafer shape over time. For instance, there is a method for controlling wafer shape in which the turn table shape itself is changed by changing conditions such as turn table temperature.

Although turn tables thought to be preferred for use in a double-side polishing apparatus are those that do not deform during wafer polishing, if such turn tables not deforming during wafer polishing are used, it will be difficult to ensure a fit between wafers and turn tables under varying polishing conditions. Moreover, it will be impossible to control wafer shape in response to changes in polishing ability and other factors of polishing pads over time.

To avoid such difficulties associated with wafer shape control, turn tables are generally made of a material that deforms to a certain extent and particularly under varying temperatures, thus allowing wafer shape control by flowing cooling water, etc., through the turn tables and changing their temperature to vary the shape of the turn tables.

However, despite an attempt to control wafer shape by flowing cooling water, etc., through the turn tables and changing their temperature, the responsiveness of turn table deformation to varying turn table temperature (linearly relative to change in turn table temperature and the like) in conventional double-side polishing was poor, making it impossible to ensure high precision in the turn table shape control. Particularly if polishing conditions and the like are substantially changed during wafer polishing, there was caused a problem that it has been impossible to control the turn tables into a desired shape through the temperature control in the turn tables alone. When a plurality of batches of wafers are polished repeatedly, it has been difficult to control the turn table shape as desired with increasing number of wafer batches due to poor responsiveness of turn table deformation, making it impossible to control batch-by-batch wafer shape stably and with high precision. In particular, repeated polishing of a plurality of batches of large-sized wafers such as 300 mm-diameter wafers has often led to a convex wafer shape, thus exhibiting remarkably deteriation of a wafer shape such that flatness of GBIR (Global Back Ideal Range), etc. is deteriorated. In other words, conventional turn table temperature control alone has failed to sufficiently control time-varying wafer shape.

DISCLOSURE OF THE INVENTION

The present invention was conceived in light of the abovementioned problem. It is a first object of the present invention to provide a wafer double-side polishing apparatus and method in which it is possible to control wafer shape by deforming turn tables with excellent responsiveness in response to changes over time in polishing ability and other factors of polishing pads attributed to their life, clogging or other cause, and to polish the wafers stably with high precision without deteriorating wafer shape even in repeated polishing of a plurality of batches of wafers. Further, it is a second object of the present invention to provide a wafer double-side polishing apparatus and method that ensure good precision in wafer shape control by controlling the turn table shape with high precision and that ensure stable polishing with high precision even during repeated polishing of a plurality of batches of wafers.

To accomplish the first object, according to the present invention, there is provided a wafer double-side polishing apparatus comprising at least a carrier plate having wafer holding holes; upper and lower turn tables to which polishing pads are attached; and a slurry supply means; with wafers held in the wafer holding holes, the carrier plate being moved between the upper and lower turn tables while supplying slurry, to simultaneously polish both front and back surfaces of wafers, wherein a PCD of upper turn table load supporting points that is a diameter of a circle joining load supporting points of the upper turn table coincides with a PCD of centers of the wafer holding holes on the carrier plate that is a diameter of a circle joining the each center of the wafer holding holes on the carrier plate.

Thus, by using such a double-side polishing apparatus comprising at least a carrier plate, upper and lower turn tables and a slurry supply means, with the carrier plate being moved between the upper and the lower turn tables to polish wafers, wherein a PCD (Pitch Circle Diameter) of upper turn table load supporting points that is a diameter of a circle (hereafter sometimes referred to as "pitch circle") joining load supporting points of the upper turn table coincides with a PCD of centers of the wafer holding holes on the carrier plate that is a diameter of a circle joining each center of wafer holding holes on the carrier plate, it is possible to provide turn table deformation with improved responsiveness to changes in polishing conditions during wafer polishing, thus facilitating the turn table shape control. Thereby, there can be provided the apparatus that allows the turn table shape control by properly changing polishing conditions in accordance with changes in polishing ability and other factors of polishing pads over time during repeated polishing of a plurality of batches of wafers, and that is capable of polishing with controlling easily batch-by-batch wafer shape without deteriorating wafer shape.

At this time, it is preferred that the motion of the carrier plate be a circular motion not accompanied by the rotation of the carrier plate.

Thus, if the carrier plate motion is a circular motion not accompanied by the rotation of the carrier plate, that is, a swinging motion in which the carrier plate circles without rotating while remaining eccentric by a given distance from the rotational axis of the upper and lower turn tables, all points on the carrier plate trace a small circular trajectory of the same size, allowing uniform polishing across both front and back surfaces of wafers.

Further, according to the present invention, there is provided a wafer double-side polishing apparatus comprising at least a plurality of carrier plates each having wafer holding holes; sun and internal gears for rotating and revolving the carrier plates; upper and lower turn tables to which polishing pads are attached; and a slurry supply means; with wafers held in the wafer holding holes, the plurality of carrier plates being rotated and revolved between the upper and lower turn tables while supplying slurry, to simultaneously polish both front and back surfaces of wafers, wherein a PCD of upper turn table load supporting points that is a diameter of a circle joining load supporting points of the upper turn table coincides with a PCD of carrier plate centers that is a diameter of a circle joining the centers of the plurality of carrier plates.

Thus, by using such a double-side polishing apparatus comprising at least carrier plates, sun and internal gears, upper and lower turn tables and a slurry supply means, with the carrier plates being rotated and revolved between the upper and the lower turn tables to polish wafers, wherein a PCD of upper turn table load supporting points that is a diameter of a circle joining load supporting points of the upper turn table coincides with a PCD of carrier plate centers that is a diameter of a circle joining the centers of the plurality of carrier plates, it is possible to provide turn table deformation with improved responsiveness to changes in polishing conditions during wafer polishing, thus facilitating the turn table shape control. This allows the turn table shape control by properly changing polishing conditions in accordance with changes in polishing ability and other factors of polishing pads over time during repeated polishing of a plurality of batches of wafers, and it is possible to polish with easily controlling batch-by-batch wafer shape without deteriorating wafer shape.

At this time, it is preferred that a PCD of lower turn table load supporting points that is a diameter of a circle joining load supporting points of the lower turn table coincide with the PCD of the upper turn table load supporting points.

Thus, if, in a double-side polishing apparatus, a PCD of lower turn table load supporting points that is a diameter of a circle joining load supporting points of the lower turn table coincides with the PCD of upper turn table load supporting points, it is possible to provide further improved responsiveness to the turn table shape control, allowing batch-bybatch wafer shape control with high precision even during polishing of a plurality of batches of wafers.

A wafer double-side polishing method in accordance with the present invention is a wafer double-side polishing method comprising holding wafers on a carrier plate on which are formed wafer holding holes for holding wafers; and, while supplying slurry, moving the carrier plate between upper and lower turn tables to which polishing pads are attached, to simultaneously polish both front and back surfaces of the wafers, wherein the wafers are polished with causing a PCD of upper turn table load supporting points that is a diameter of a circle joining load supporting points of the upper turn table and a PCD of wafer centers that is a diameter of a circle joining centers of the wafers held by the carrier plate to coincide with each other.

In the double-side polishing method for simultaneously polishing both front and back surfaces of wafers as described above, by polishing the wafers with causing a PCD of upper turn table load supporting points that is a diameter of a circle joining the load supporting points of the upper turn table and a PCD of wafer centers that is a diameter of a circle joining centers of the wafers held by the carrier plate to coincide with each other, it is possible to easily control the turn table shape with excellent responsiveness. This allows precise control in the turn table shape in accordance with change in wafer shape over time, thus enabling stable polishing while maintaining wafer shape with good precision even during repeated polishing of a plurality of batches of wafers.

At this time, it is preferred that the motion of the carrier plate be a circular motion not accompanied by the rotation of the carrier plate.

Thus, by ensuring that the carrier plate motion is a circular motion not accompanied by the rotation of the carrier plate, it is possible to conduct uniform polishing across both front and back surfaces of wafers held by the carrier plate.

Further, according to the present invention, there is provided a wafer double-side polishing method comprising holding wafers on a plurality of carrier plates each having thereon formed holding holes for holding wafers; and, while supplying slurry, rotating and revolving the plurality of carrier plates using sun and internal gears between upper and lower turn tables to which polishing pads are attached, to simultaneously polish both front and back surfaces of the wafers, wherein the wafers are polished with causing a PCD of upper turn table load supporting points that is a diameter of a circle joining load supporting points of the upper turn table and a PCD of carrier plate centers that is a diameter of a circle joining centers of the plurality of carrier plates to coincide with each other.

In a double-side polishing method for simultaneously polishing both front and back surfaces of wafers as described above, by polishing wafers with causing a PCD of upper turn table load supporting points that is a diameter of a circle joining the load supporting points of the upper turn table and a PCD of carrier plate centers that is a diameter of a circle joining centers of the plurality of carrier plates to coincide with each other, it is possible to easily control the turn table shape with excellent responsiveness. This allows precise control in the turn table shape in accordance with change in wafer shape over time, thus enabling stable polishing while maintaining wafer shape with good precision even during repeated polishing of a plurality of batches of wafers.

At this time, it is preferred that a PCD of lower turn table load supporting points that is a diameter of a circle joining load supporting points of the lower turn table be caused to coincide with the PCD of the upper turn table load supporting points.

Thus, by causing a PCD of lower turn table load supporting points that is a diameter of a circle joining load supporting points of the lower turn table to coincide with the PCD of the upper turn table load supporting points, it is possible to provide the turn table shape control with further improved responsiveness, thus allowing reliable suppression in batch-by-batch wafer shape change even during polishing of a plurality of batches of wafers.

Further at this time, it is preferred that during the wafer polishing, the wafers be polished while controlling polishing conditions and that the polishing conditions be controlled by controlling the upper and/or lower turn table temperature.

Thus, by polishing wafers while controlling the polishing conditions and preferably the upper and/or lower turn table temperature during the wafer polishing, it is possible to control the turn table shape with excellent responsiveness even during repeated polishing of a plurality of batches of wafers. This allows polishing of a plurality of batches of wafers without deteriorating wafer shape, thus making it possible to maintain polished batch-by-batch wafer shape stably with good precision.

To accomplish the second object, according to the present invention, there is provided a wafer double-side polishing apparatus comprising at least a carrier plate having wafer holding holes; upper and lower turn tables to which polishing pads are attached; and a slurry supply means; with wafers held in the wafer holding holes, the carrier plate being moved between the upper and lower turn tables while supplying slurry, to simultaneously polish both front and back surfaces of wafers, wherein shape adjustment means are disposed at load supporting point portions of the upper turn table.

Thus, by using such a double-side polishing apparatus comprising at least a carrier plate, upper and lower turn tables and a slurry supply means, with the carrier plate being moved between the upper and the lower turn tables to polish both front and back surfaces of wafers, wherein shape adjustment means are disposed at load supporting point portions of the upper turn table, it is possible to forcibly deform the upper turn table shape with the shape adjustment means, allowing proper the turn table shape control in accordance with changes in polishing ability and other factors of polishing pads over time during wafer polishing. Thereby, there can be provided the apparatus that ensures good precision and stability in wafer shape during polishing, and that is capable of polishing with easily controlling batch-by-batch wafer shape without deteriorating wafer shape even during repeated polishing of a plurality of batches of wafers.

At this time, it is preferred that the motion of the carrier plate be a circular motion not accompanied by the rotation of the carrier plate.

Thus, if the carrier plate motion is a circular motion not accompanied by the rotation of the carrier plate, that is, a swinging motion in which the carrier plate circles without rotating while remaining eccentric by a given distance from the rotational axis of the upper and lower turn tables, all points on the carrier plate trace a small circular trajectory of the same size, allowing uniform polishing across both front and back surfaces of wafers.

Further at this time, it is preferred that a PCD of upper turn table load supporting points that is a diameter of a circle joining the load supporting points of the upper turn table coincide with a PCD of centers of the wafer holding holes on the carrier plate that is a diameter of a circle joining each center of the wafer holding holes on the carrier plate.

Thus, by using such a double-side polishing apparatus in which a PCD (Pitch Circle Diameter) of upper turn table load supporting points that is a diameter of a circle joining load supporting points of the upper turn table coincides with a PCD of centers of the wafer holding holes on the carrier plate that is a diameter of a circle joining each center of the wafer holding holes on the carrier plate, it is possible to provide turn table deformation with further improved responsiveness to adjustment of the shape adjustment means, adjustment of slurry supply amount, etc. thus allowing easy and precise control in the turn table shape.

Further, according to the present invention, there is provided a wafer double-side polishing apparatus, comprising at least a plurality of carrier plates each having wafer holding holes; sun and internal gears for rotating and revolving the carrier plates; upper and lower turn tables to which polishing pads are attached; and slurry supply means; with wafers held in the wafer holding holes, the plurality of carrier plates being rotated and revolved between the upper and lower turn tables while supplying slurry, to simultaneously polish both front and back surfaces of wafers, wherein shape adjustment means are disposed at load supporting point portions of the upper turn table.

Thus, by using such a double-side polishing apparatus comprising at least carrier plates, sun and internal gears, upper and lower turn tables and a slurry supply means, with the plurality of carrier plates being rotated and revolved between the upper and lower turn tables to polish both front and back surfaces of wafers, wherein shape adjustment means are disposed at load supporting point portions of the upper turn table, it is possible to forcibly deform the upper turn table shape with the shape adjustment means, allowing proper the turn table shape control in accordance with changes in polishing ability and other factors of polishing pads over time during wafer polishing. Thereby, there can be provided the apparatus that ensures good precision and stability in wafer shape during polishing, and that is capable of polishing with easily controlling batch-by-batch wafer shape without deteriorating wafer shape even during repeated polishing of a plurality of batches of wafers.

At this time, it is preferred that a PCD of upper turn table load supporting points that is a diameter of a circle joining load supporting points of the upper turn table coincide with a PCD of carrier plate centers that is a diameter of a circle joining centers of the plurality of carrier plates.

Thus, by using such a double-side polishing apparatus in which a PCD of upper turn table load supporting points that is a diameter of a circle joining the load supporting points of the upper turn table coincides with a PCD of carrier plate centers that is a diameter of a circle joining centers of the plurality of carrier plates, it is possible to provide turn table deformation with further improved responsiveness to adjustment of the shape adjustment means, adjustment of slurry supply amount, etc. thus allowing easy and precise control in the turn table shape.

Further, it is preferred that the shape adjustment means be micrometers.

Thus, if the shape adjustment means are micrometers, it is possible to mechanically press the upper turn table by a desired magnitude and forcibly deform the upper turn table through adjustment of the micrometers, allowing precise deformation of the table into a desired shape.

It is also preferred that materials of the turn table be stainless steel.

Thus, if the turn table is made of stainless steel, it is possible to properly deform the turn table, allowing easy deformation of the turn table with the shape adjustment means, etc.

A wafer double-side polishing method in accordance with the present invention is a wafer double-side polishing method comprising holding wafers in wafer holding holes formed on a carrier plate; and while supplying slurry, moving the carrier plate between upper and lower turn tables to which polishing pads are attached, to simultaneously polish both front and back surfaces of the wafers, wherein the wafers are polished while controlling the turn table shape by adjusting the slurry supply amount.

In such a double-side polishing method for simultaneously polishing both front and back surfaces of wafers as described above, it is possible to control polishing surface temperature by adjusting slurry supply amount during polishing, thus allowing the turn table shape control with excellent responsiveness. This ensures stable polishing without deteriorating wafer shape.

At this time, it is preferred that the motion of the carrier plate be a circular motion not accompanied by the rotation of the carrier plate.

Thus, by ensuring that the carrier plate motion is a circular motion not accompanied by the rotation of the carrier plate, it is possible to conduct uniform polishing across both front and back surfaces of wafers held by the carrier plate.

Further, according to the present invention, there is provided a wafer double-side polishing method comprising holding wafers on a plurality of carrier plates each having thereon formed holding holes for holding wafers; and while supplying slurry, rotating and revolving the plurality of carrier plates using sun and internal gears between upper and lower turn tables to which polishing pads are attached, to simultaneously polish both front and back surfaces of the wafers, wherein the wafers are polished while controlling the turn table shape by adjusting the slurry supply amount.

In such a double-side polishing method for simultaneously polishing both front and back surfaces of wafers as described above, it is possible to control polishing surface temperature by adjusting slurry supply amount during polishing, thus allowing the turn table shape control with excellent responsiveness. This ensures stability in polishing without deteriorating wafer shape.

At this time, it is preferred that the slurry supply amount be adjusted in accordance with usage time of the polishing pads.

Thus, by adjusting slurry supply amount in accordance with usage time of polishing pads, it is possible to ensure good precision in the turn table shape control in accordance with changes in polishing ability and other factors of polishing pads over time. For instance, it suffices to adjust slurry supply amount such that supply amount is reduced with increasing usage time of polishing pads. Thus, by adjusting slurry supply amount, it is possible to conduct polishing stably without deteriorating wafer shape even during repeated polishing of a plurality of batches of wafers.

Further, a wafer double-side polishing method according to the present invention is a wafer double-side polishing method comprising holding wafers in wafer holding holes formed on a carrier plate; and while supplying slurry, moving the carrier plate between upper and lower turn tables to which polishing pads are attached, to simultaneously polish both front and back surfaces of the wafers, wherein shape adjustment means are disposed at load supporting point portions of the upper turn table, and wherein the wafers are polished while controlling the turn table shape by adjusting the shape adjustment means.

In such a double-side polishing method for simultaneously polishing both front and back surfaces of wafers as described above, it is possible, by providing shape adjustment means at the load supporting point portions of the upper turn table and conducting polishing while controlling the turn table shape through adjustment of the shape adjustment means, to forcibly deform the upper the turn table shape with the shape adjustment means, allowing proper the turn table shape control in accordance with changes in polishing ability and other factors of polishing pads over time during wafer polishing. This ensures good precision and stability in wafer shape during polishing and allows precise wafer shape control and stable polishing without deteriorating wafer shape even during repeated polishing of a plurality of batches of wafers.

At this time, it is preferred that the motion of the carrier plate be a circular motion not accompanied by the rotation of the carrier plate.

Thus, by ensuring that the carrier plate motion is a circular motion not accompanied by the rotation of the carrier plate, it is possible to conduct uniform polishing across both front and back surfaces of wafers held by the carrier plate.

Further, according to the present invention, there is provided a wafer double-side polishing method comprising holding wafers on a plurality of carrier plates each having thereon formed holding holes for holding wafers; and while supplying slurry, rotating and revolving the plurality of carrier plates using sun and internal gears between upper and lower turn tables to which polishing pads are attached, to simultaneously polish both front and back surfaces of the wafers, wherein shape adjustment means are disposed at load supporting point portions of the upper turn table, and wherein the wafers are polished while controlling the turn table shape by adjusting the shape adjustment means.

In such a double-side polishing method for simultaneously polishing both front and back surfaces of wafers as described above, it is possible, by providing shape adjustment means at the load supporting point portions of the upper turn table and conducting polishing while controlling the turn table shape through adjustment of the shape adjustment means, to forcibly deform the upper the turn table shape with the shape adjustment means, allowing proper the turn table shape control in accordance with changes in polishing ability and other factors of polishing pads over time during wafer polishing. This ensures good precision and stability in wafer shape during polishing and allows precise wafer shape control and stable polishing without deteriorating wafer shape even during repeated polishing of a plurality of batches of wafers.

At this time, it is preferred that the wafer be polished while controlling the turn table shape by adjusting supply amount of the slurry supplied.

By providing shape adjustment means at the load supporting point portions of the upper turn table as described above and thus further adjusting the slurry supply amount, it is possible to control the turn table shape with further high precision, reliably preventing deterioration of wafer shape.

Further at this time, it is preferred that, the wafers be polished with causing a PCD of upper turn table load supporting points that is a diameter of a circle joining load supporting points of the upper turn table and a PCD of wafer centers that is a diameter of a circle joining centers of the wafers held by the carrier plate to coincide with each other, or causing the PCD of upper turn table load supporting points and a PCD of carrier plate centers that is a diameter of a circle joining centers of the plurality of carrier plates to coincide with each other.

In the double-side polishing method, by polishing with causing a PCD of upper turn table load supporting points that is a diameter of a circle joining the load supporting points of the upper turn table and a PCD of wafer centers that is a diameter of a circle joining centers of the wafers held by the carrier plate to coincide with each other, or causing the PCD of upper turn table load supporting points and a PCD of carrier plate centers that is a diameter of a circle joining centers of the plurality of carrier plates to coincide with each other, it is possible to control the turn table shape with excellent responsiveness through adjustment of the slurry supply amount or adjustment of the shape adjustment means such as micrometers. This allows precise the turn table shape control in response to change in wafer shape over time, ensuring good precision in wafer shape control and stability in polishing even during repeated polishing of a plurality of batches of wafers.

As described above, according to the present invention, by causing, during wafer polishing, the PCD of upper turn table load supporting points and the average PCD of centers of wafers held by a carrier plate to coincide with each other or the PCD of upper turn table load supporting points and the PCD of centers of the plurality of carrier plates to coincide with each other, it is possible to provide turn table deformation with improved responsiveness, allowing precise wafer shape control. Further, excellent responsiveness of turn table deformation allows stable wafer shape control with high precision by properly changing polishing conditions during repeated polishing of a plurality of batches of wafers.

Further, according to the present invention, by adjusting slurry supply amount, or by providing shape adjustment means at load supporting point portions of the upper turn table and adjusting the shape adjustment means during wafer polishing, it is possible to control the turn table shape with excellent responsiveness. This ensures good precision and stability in wafer shape during polishing, and it is possible to control batch-by-batch wafer shape with high precision and to perform stably polishing without deteriorating wafer shape even during repeated polishing of a plurality of batches of wafers.

BEST MODE FOR CARRYING OUT THE INVENTION

Hereinafter, embodiments of the present invention will be explained. However, the present invention is not limited thereto.

Figure 5:
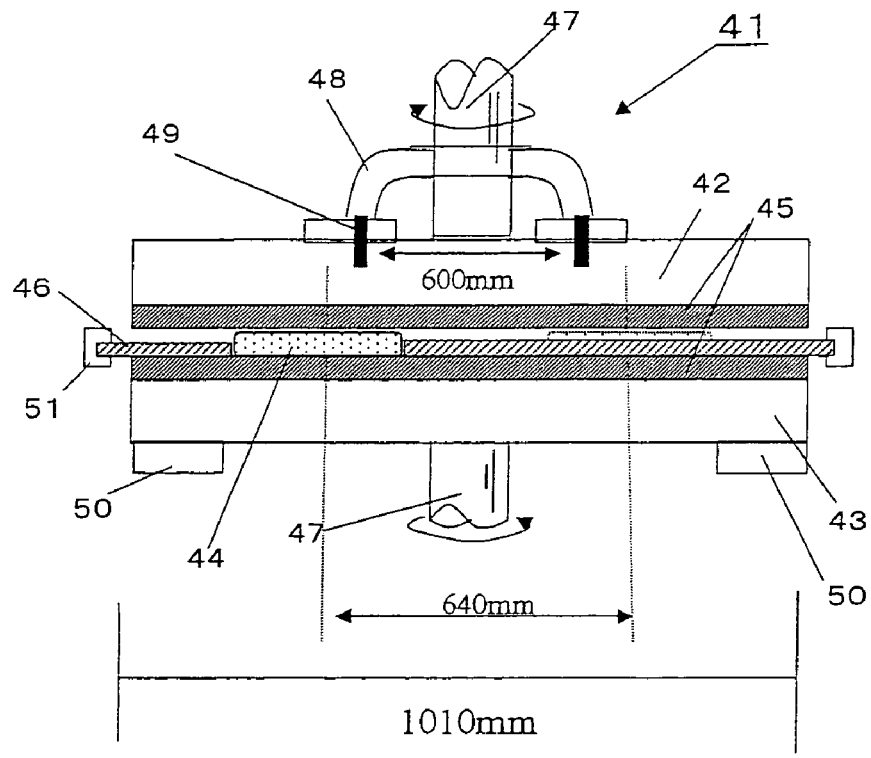
FIG. 5 illustrates a sectional explanatory view showing an example of conventional double-side polishing apparatus.

When wafers are repeatedly polished using a conventional double-side polishing apparatus as shown in FIG. 5, as the number of wafer batches to be polished increases it has become difficult to control the turn table shape with high precision due to poor responsiveness of turn table deformation (e.g., linearly relative to changes in polishing conditions), making it impossible to control wafer shape stably and with high precision (first problem). Due to poor responsiveness of turn table deformation, it has been impossible to precisely control the turn table into a desired shape with turn table temperature control alone, hindering stability and high precision in wafer shape control (second problem).

To solve the first problem, therefore, the present inventors, as a result of diligent study, perfected the present invention upon discovering that, noting the relationship between supporting points of the upper turn table and the carrier plate position (or polished wafer position), it is possible to control the turn table shape with excellent responsiveness in accordance with changes in polishing conditions, etc. by adjusting a positional relationship therebetween, and thereby it is possible to repeatedly polish wafers while suppressing deterioration in wafer shape and maintaining good precision and stability in wafer shape even during repeated polishing of a plurality of batches of wafers.

Further, to solve the second problem, the present inventors, as a result of diligent study, perfected the present invention upon devising that, as additional the turn table shape is controlled methods in addition to turn table temperature control, the turn table shape is controlled through adjustment of supply amount of slurry supplied during polishing and through adjustment of the shape adjustment means by providing the shape adjustment means at load supporting point portions of the upper turn table.

Figure 1:
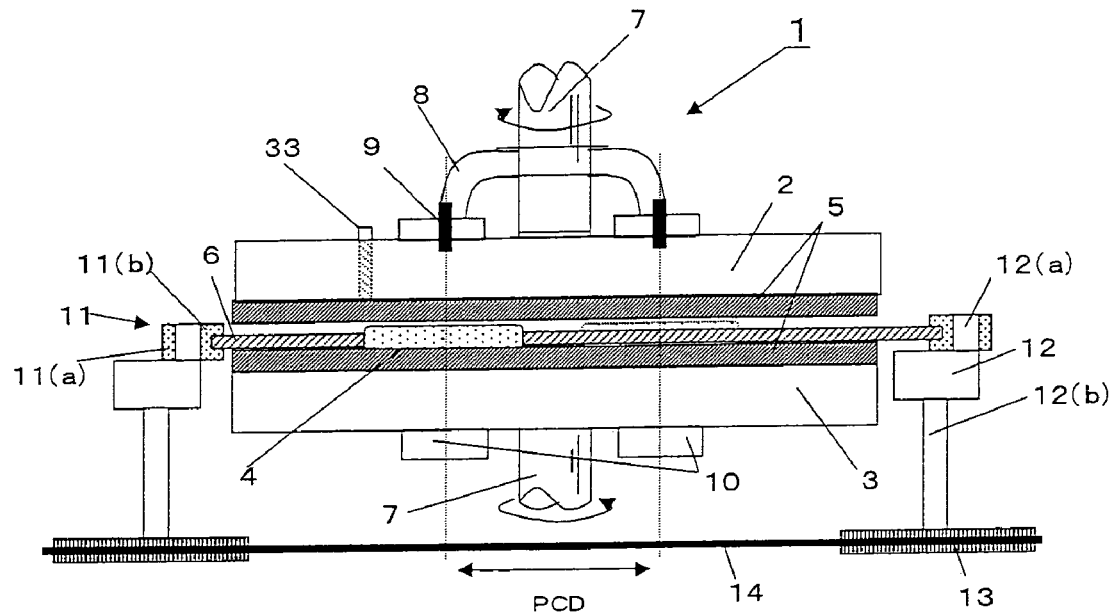
FIG. 1 illustrates a schematic sectional explanatory view showing an example of double-side polishing apparatus associated with a first embodiment of the present invention.
Figure 2:
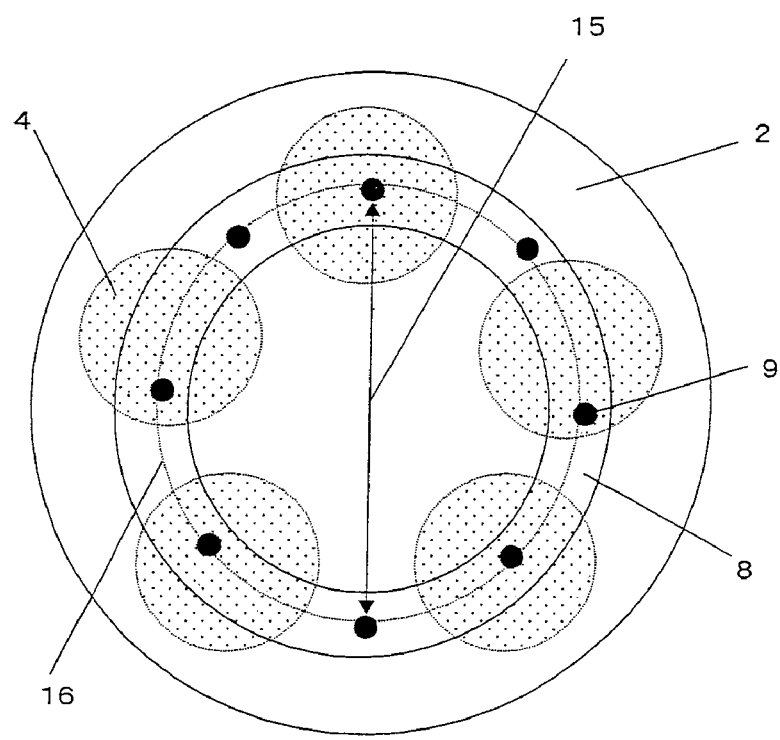
FIG. 2 illustrates a plan view of an upper turn table in the double-side polishing apparatus shown in FIG. 1.
Figure 3:
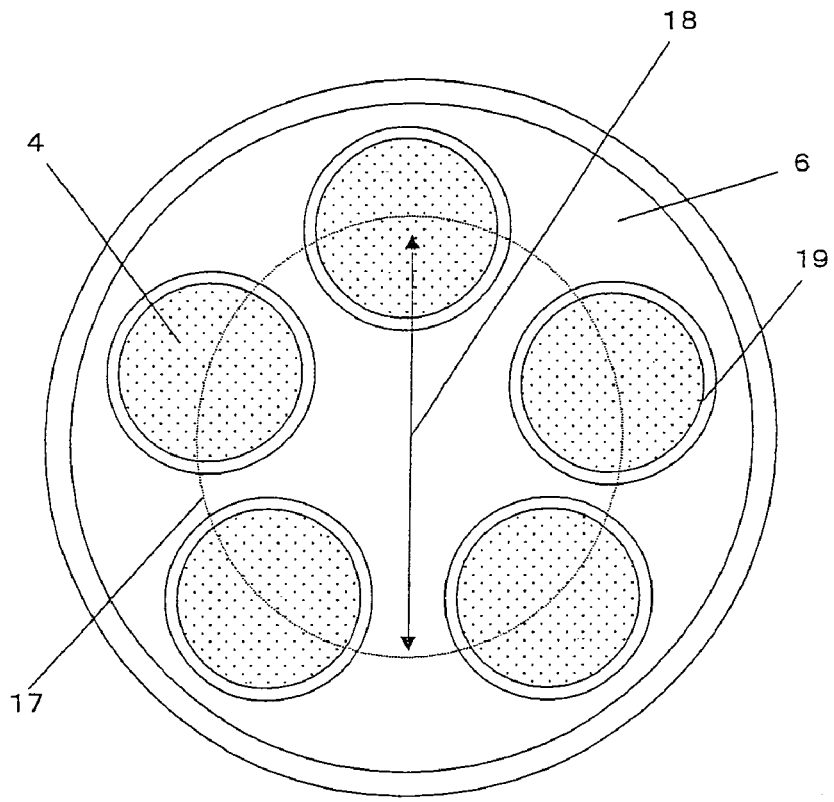
FIG. 3 illustrates a plan view of a carrier plate in the double-side polishing apparatus shown in FIG. 1.

First, an example of wafer double-side polishing apparatus associated with a first embodiment of the present invention will be described with reference to accompanying drawings. FIG. 1 illustrates a schematic sectional explanatory view of a double-side polishing apparatus associated with the first embodiment of the present invention. FIGS. 2 and 3 illustrate plan views of an upper turn table and a carrier plate, respectively.

A double-side polishing apparatus 1 has a carrier plate 6 with wafer holding holes, upper and lower turn tables 2 and 3 to which polishing pads 5 are attached and a slurry supply means 33 for supplying slurry, and can simultaneously polish both front and back surfaces of wafers 4 by inserting the wafers 4 into and holding them in the wafer holding holes on the carrier plate 6, sandwiching the wafers with the upper and lower turn tables 2 and 3 from above and below the wafers and rotating the upper and lower turn tables 2 and 3 on a rotation axis perpendicular to the wafers 4 while supplying slurry from the slurry supply means.

The upper turn table 2 is provided with a cylinder 7 for applying rotation and polishing loads, a housing 8 for transmitting those loads to the upper turn table 2 and fixing means 9 such as bolts for fixing the housing 8 and the upper turn table 2, and further equipped with temperature regulating means (not shown) therein for controlling the turn table temperature. Although the temperature regulating means are not specifically limited, they are designed to supply cooling and hot water into piping provided within the turn table.

On the other hand, the lower turn table 3 is provided with the cylinder 7 for imparting rotation from a motor and a speed reducer (not shown) to the lower turn table and thrust bearings 10 that support the load of the turn tables. The lower turn table is also equipped with temperature regulating means not shown therein for controlling the turn table temperature as with the upper turn table.

The polishing pads 5 for mirror-polishing front and back surfaces of the wafers are attached to the under surface of the upper turn table 2 and the top surface of the lower turn table 3 in the double-side polishing apparatus 1. Although types and materials of the polishing pads are not limited, for example, hard polyurethane foam pads and soft non-woven cloth pads made by hardening polyurethane-resin-impregnated non-woven cloth, which are ordinary polishing pads, are among usable pads. As soft non-woven cloth, Suba600 manufactured by Rodel Inc. is employed, for example. In addition, polishing pads of two or more layers made by foaming polyurethane resin on top of a base cloth made of non-woven cloth can also be used.

The carrier plate 6 is, for example, a disk-shaped plate on which five wafer holding holes 19 are formed as shown in FIG. 3. The wafers 4 are held in the wafer holding holes 19 so as to be rotatable. Although the material and other properties of the carrier plate 6 are not specifically limited, it is preferred that the carrier plate 6 made, for example, of glass epoxy be used.

The perimeter portion of the carrier plate 6 is held by an annular portion 11(b) of a carrier holder 11, causing the carrier plate 6 to make a circular motion in a plane (horizontal plane) parallel to the surface of the carrier plate 6 without the carrier plate 6 itself rotating. The perimeter of the annular portion 11(b) of the carrier holder 11 is provided with a plurality of bearing portions 11(a) projecting outward. An eccentric shaft 12(a) of an eccentric arm 12 in the form of a small-diameter disk is attached by insertion to each of the bearing portions 11(a) of the carrier holder, with a rotary shaft 12(b) installed vertically at a central portion of each of the under surfaces of the eccentric arms 12. Further, a sprocket 13 is fastened to the end of each of the rotary shafts 12(b), with a timing chain 14 being stretched among each of the sprockets in a horizontal state in a serial manner.

The sprockets 13 and the timing chain 14 together constitute synchronization means for rotating the plurality of eccentric arms 12 synchronously.

Rotation is imparted to one of the sprockets 13 by operating a circular motion motor (not shown) connected to one of the sprockets 13. As a result of rotation of the timing chain 14 via the sprocket 13 to perform cyclic motion of the timing chain, the plurality of eccentric arms 12 rotate in synchronization on the rotary shafts 12(b) in a horizontal plane. This allows the carrier holder 11 coupled to each of the eccentric arms 12 and the carrier plate 6 held by the carrier holders 11 to make a circular motion that is a circling taking place eccentrically from the rotational axis of the upper and lower turn tables 2 and 3, in a horizontal plane parallel to the carrier plate, by the same distance as that between the eccentric shaft 12(a) and the rotary shaft 12(b) in the eccentric arm 12.

Thus, by causing the carrier plate to make a circular motion not accompanied by the rotation of the carrier plate, all points on the carrier plate 6 trace a small circular trajectory of the same size, allowing uniform polishing across both front and back surfaces of the wafers 4 held by the carrier plate 6.

In such the double-side polishing apparatus 1, it is possible, by causing a PCD (Pitch Circle Diameter) of upper turn table load supporting points that is a diameter of a circle (pitch circle) joining the load supporting points of the upper turn table 2 and a PCD of centers of the wafer holding holes on the carrier plate that is a diameter of a circle (pitch circle) joining each center of the wafer holding holes on the carrier plate 6 to coincide with each other, to provide turn table deformation with improved responsiveness to changes in polishing conditions during wafer polishing, thus making the double-side polishing apparatus 1 capable of repeated wafer polishing while controlling polished wafer shape with high precision.

More specifically, the upper turn table 2 of the double-side polishing apparatus 1 is held to the housing 8 by the fixing means 9 such as bolts, with a given load applied during polishing. For this reason, load supporting points of the upper turn table 2 are located on the fixing means 9 that are joining portions between the upper turn table 2 and the housing 8 as shown in FIG. 2. Consequently, the PCD of upper turn table load supporting points can be expressed by a diameter 15 of a circle 16 joining the centers of the fixing means 9 that are the load supporting points of the upper turn table. The PCD of centers of the wafer holding holes on the carrier plate 6 can be, in the case of a double-side polishing apparatus with the single carrier plate 6 as described above, expressed by a diameter 18 of a circle 17 joining the centers of the wafer holding holes 19 (the centers roughly coincide with wafer centers of the wafers 4 held by the carrier plate 6) formed on the carrier plate 6 as shown in FIG. 3.

It is possible to cause the PCD of upper turn table load supporting points and the PCD of centers of the wafer holding holes on the carrier plate to coincide with each other in design stage of double-side polishing apparatus by adjusting the upper turn table and the carrier plate. As for existing double-side polishing apparatuses, it is possible and convenient to cause the PCD of upper turn table load supporting points and the PCD of centers of the wafer holding holes on the carrier plate to coincide with each other in carrier plate manufacture stage by adjusting the positions of wafer holding holes.

At this time, it is important to cause the PCD of upper turn table load supporting points and the PCD of centers of the wafer holding holes on the carrier plate to coincide with each other, and it is preferred that these pitch circles be located at the same position during polishing. However, if the carrier plate 6 of the double-side polishing apparatus 1 makes a circular motion that is a circling taking place eccentrically from the rotational axis of the upper and lower turn tables as described above, although the diameter of the pitch circle formed by load supporting points of the upper turn table coincides with that formed by centers of wafer holding holes of the carrier plate, the position of the pitch circle of centers of wafer holding holes on the carrier plate 6 changes over time during polishing. Therefore, it is impossible to ensure a constant coincidence between the pitch circle of turn table load supporting points and the pitch circle of centers of the wafer holding holes on the carrier plate. In this case, consequently, it suffices to cause the pitch circle of upper turn table load supporting points and the circle joining the average position of small circular trajectories of centers of the wafer holding holes on the carrier plate (wafer centers of wafers held by the carrier plate) to coincide with each other, and coincidence of PCDs as referred to in the present invention includes coincidence of diameters and coincidence of such pitch circle positions.

In the double-side polishing apparatus shown in FIG. 1, it is preferred that a PCD of lower turn table load supporting points that is a diameter of a circle joining the load supporting points of the lower turn table 3 coincide with the PCD of upper turn table load supporting points. As described above, in the double-side polishing apparatus 1 of the present invention, the lower turn table 3 is held by the thrust bearings 10, with a given load applied during polishing. Therefore, load supporting points of the lower turn table 3 are located on joining portions with the thrust bearings 10. Consequently, the PCD of lower turn table load supporting points can be expressed by a diameter of a circle joining fixing portions of the thrust bearings 10. Thus, by causing the PCD of lower turn table load supporting points to coincide with the PCD of upper turn table load supporting points, it is possible to improve further responsiveness in the turn table shape control.

For coincidence the PCD of upper turn table load supporting points with the PCD of centers of the wafer holding holes on the carrier plate (wafer centers of wafers held by the carrier plate) and coincidence the PCD of upper turn table load supporting points with the PCD of lower turn table load supporting points, it suffices to cause these PCDs to coincide with each other, including diameters and pitch circle positions, within a tolerance of 5 mm or less. While perfect coincidences are preferred between the PCD of upper turn table load supporting points and the PCD of centers of the wafer holding holes on the carrier plate and between the PCD of upper turn table load supporting points and the PCD of lower turn table load supporting points, it is only natural that a certain amount of tolerance actually occurs. In consideration of eccentricity during polishing, it is possible to improve sufficiently responsiveness of turn table deformation to changes in polishing conditions by achieving a coincidence within a tolerance of 5 mm or less. That is, coincidence of the PCDs as referred to in the present invention may include cases in which such a certain amount of tolerance exists.

Next, a method for simultaneously polishing both front and back surfaces of wafers will be demonstrated using the double-side polishing apparatus shown in FIG. 1 in which the PCD of upper turn table load supporting points coincides with the PCD of centers of the wafer holding holes on the carrier plate.

First, the wafers 4 are inserted into and held by the carrier plate 6 on which the wafer holding holes are formed. Then, the wafers 4 held by the carrier plate 6 are sandwiched by the upper and lower turn tables 2 and 3, to which the polishing pads 5 are attached, using an elevating device (not shown) for causing the upper and lower turn tables 2 and 3 to advance or retreat along the rotational axis. Then, the upper turn table 2 is rotated by an upper rotation motor (not shown) via the cylinder 7 in a horizontal plane and the lower turn table 3 is rotated by a lower rotation motor (not shown) via the cylinder 7 in a horizontal plane while supplying slurry from the slurry supply means 33. At this time, the wafers 4 are held in the wafer holding holes on the carrier plate 6 so as to be rotatable, allowing the wafers 4 to turn together (rotate) in the direction of rotation of the faster rotating turn table by adjusting the rotation speeds of the upper and lower turn tables 2 and 3. At the same time the upper and lower turn tables 2 and 3 are rotated, the carrier plate 6 is caused to make a circular motion not accompanied by its rotation by the carrier holders 11 to which the eccentric arms 12 are attached by insertion. Thus, the PCD of upper turn table load supporting points coincides with the PCD of centers of the wafer holding holes on the carrier plate and further with the PCD of lower turn table load supporting points, making it possible to polish uniformly both front and back surfaces of the wafers 4 simultaneously.

At this time, neither rotation speeds of the upper and lower turn tables 2 and 3 nor their rotation directions nor pressing forces applied to the wafers 4 by the upper and lower turn tables 2 and 3 are limited. It is preferred that pressing on front and back surfaces of the silicon wafers by the upper and lower turn tables 2 and 3 be applied by a pressure application method via a fluid, etc. Pressure is applied primarily by a housing portion arranged on the upper turn table. Normally, pressing forces applied to the wafers by the upper and lower turn tables are 100 to 300 g/cm2. At this time, polishing amount and polishing speed in front and back surfaces of the wafers are not particularly limited.

The slurry supply means 33 can be, for example, constituted by forming a plurality of slurry supply holes on the upper turn table. It is preferred that the plurality of slurry supply holes be constituted such that slurry is constantly supplied to the wafer surfaces even in the event of wafer swinging and that the slurry supply holes be arranged in an area in the form of an annular ring of a given width in which the wafers always exist. In this case, type of slurry used is not limited. For instance, when silicon wafers are polished, alkali solution with pH9 to 11 containing colloidal silica can be used. Although slurry supply amount is not limited since the amount varies depending on the carrier plate size, the amount is normally 2.0 to 6.0 liters/min.

Thus, by polishing the wafers with causing the PCD of upper turn table load supporting points that is the diameter of the circle joining the load supporting points of the upper turn table and the PCD of wafer centers that is the diameter of the circle joining centers of the wafers held by the carrier plate to coincide with each other, it is possible to improve responsiveness of the turn table shape control to changes in polishing conditions. Therefore, by improving responsiveness of turn table deformation as described above during simultaneous polishing of both front and back surfaces of the wafers and by conducting wafer polishing while controlling polishing conditions such as the upper and/or lower turn table temperature, it is possible to conduct polishing while easily controlling wafer shape through the turn table shape deformation so as to compensate for variations in polished wafer shape associated with progress of polishing. This allows suppression of change in wafer shape over time and ensures good precision and stability in wafer shape control without deteriorating wafer shape during polishing of a plurality of batches of wafers.

Note that although, in the aforementioned double-side polishing apparatus, it was explained about a case in which a plurality of wafers are held by the carrier plate and wafer polishing is performed, the present invention is not limited thereto. For instance, the present invention is also applicable to a case in which wafers are held one by one on the carrier plate (single wafer processing) and wafer polishing is performed. In this case, a similar effect can be achieved by causing the PCD of upper turn table load supporting points and the diameter of the wafer held by the carrier plate to coincide with each other, and the present invention includes such a case.

Figure 4:
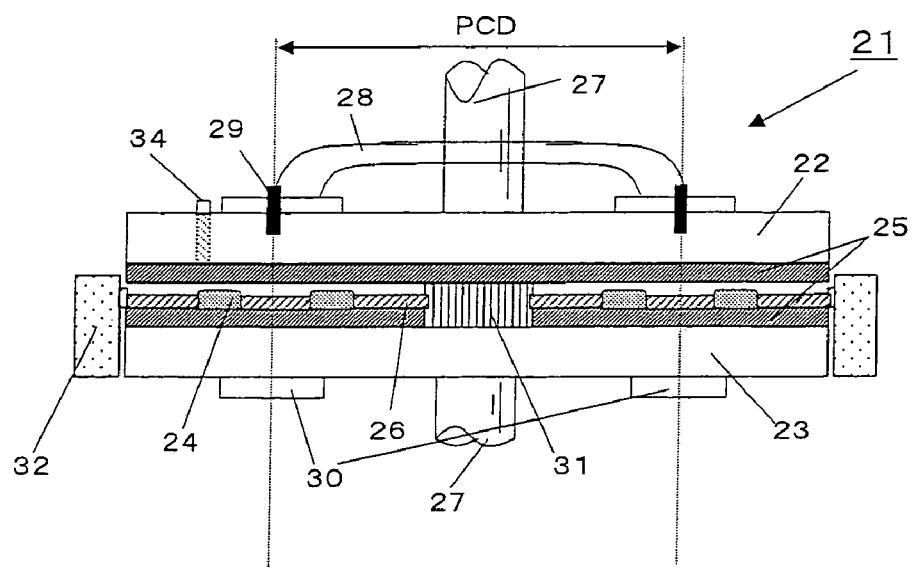
FIG. 4 illustrates a schematic sectional explanatory view showing an example of another form of (four-way) double-side polishing apparatus associated with the first embodiment of the present invention.

Next, another form of double-side polishing apparatus associated with the first embodiment of the present invention will be described. FIG. 4 illustrates a schematic sectional explanatory view of a four-way double-side polishing apparatus in accordance with the present invention.

A four-way double-side polishing apparatus 21 has a plurality of carrier plates 26 with wafer holding holes, sun and internal gears 31 and 32 for rotating and revolving the carrier plates, upper and lower turn tables 22 and 23 to which polishing pads 25 are attached and a slurry supply means 34, and can simultaneously polish both front and back surfaces of wafers 24 by inserting the wafers 24 into and holding them in the wafer holding holes on the plurality of carrier plates 26, sandwiching the plurality of carrier plates 26 with the upper and lower turn tables 22 and 23, to which the polishing pads 25 are attached, from above and below the carrier plates, rotating and revolving the carrier plates with the sun and internal gears 31 and 32 while supplying slurry from the slurry supply means and rotating the upper and lower turn tables 22 and 23 on a rotational axis perpendicular to the wafers 24.

At this time, the upper turn table 22 is provided with a cylinder 27 for applying rotation and polishing loads, a housing 28 for transmitting those loads to the upper turn table and fixing means 29 such as bolts for fixing the housing and the upper turn table, and further equipped with temperature regulating means (not shown) therein for controlling the turn table temperature. On the other hand, the lower turn table 23 is provided with the cylinder 27 for imparting rotation from a motor and a speed reducer (not shown) to the lower turn table and thrust bearings 30 that support the load of the turn tables. The lower turn table 23 is also equipped with temperature regulating means (not shown) therein for controlling the turn table temperature.

For use as the polishing pads 25 attached to the under surface of the upper turn table 22 and the top surface of the lower turn table 23 in the double-side polishing apparatus 21, hard polyurethane foam pads and soft non-woven cloth pads made by hardening polyurethane-resin-impregnated non-woven cloth, which are ordinary polishing pads, are among usable pads as mentioned earlier.

Thus, by causing, in the double-side polishing apparatus 21, a PCD of upper turn table load supporting points that is a diameter of a circle joining the load supporting points of the upper turn table 22 and a PCD of carrier plate centers that is a diameter of a circle joining centers of the plurality of carrier plates 26 to coincide with each other, it is possible to improve responsiveness of turn table deformation to changes in polishing conditions during wafer polishing, thus making the double-side polishing apparatus capable of repeated wafer polishing while controlling wafer shape with high precision.

More specifically, the upper turn table 22 of the double-side polishing apparatus 21 is held to the housing 28 by the fixing means 29 such as bolts as described above. For this reason, load supporting points of the upper turn table 22 are located on the fixing means 29 that are joining portions between the upper turn table 22 and the housing 28. Consequently, the PCD of upper turn table load supporting points can be expressed by the diameter of the circle joining the centers of the fixing means 29 that are load supporting points of the upper turn table. Since a plurality of wafer holding holes are formed on the carrier plates in such a double-side polishing apparatus, it is difficult to cause the average PCD of centers of wafer holding holes of the carrier plates (centers of wafers held by the carrier plates) to coincide with the PCD of upper turn table load supporting points. In the case of the double-side polishing apparatus 21, for this reason, the PCD of carrier plate centers that is the diameter of the circle joining centers of the plurality of carrier plates 26 is caused to coincide with the PCD of upper turn table load supporting points.

Further, it is preferred that a PCD of lower turn table load supporting points that is a diameter of a circle joining the load supporting points of the lower turn table 23 coincides with the PCD of the upper turn table load supporting points. Since the lower turn table is held by the thrust bearings 30 in the double-side polishing apparatus 21 as described above, load supporting points of the lower turn table 23 are located on joining portions with the thrust bearings 30. Consequently, the PCD of lower turn table load supporting points can be expressed by a diameter of a circle joining fixing portions of the thrust bearings 30. Thus, by causing the PCD of lower turn table load supporting points to coincide with the PCD of the upper turn table load supporting points, it is possible to further improve responsiveness of the turn table shape control.

At this time, while perfect coincidences are preferred between the PCD of upper turn table load supporting points and the PCD of carrier plate centers and between the PCD of upper turn table load supporting points and the PCD of lower turn table load supporting points, it suffices to achieve a coincidence within a tolerance of 5 mm or less as mentioned earlier, thus improving responsiveness of turn table deformation to changes in polishing conditions. The present invention includes such a case.

Next, a method for simultaneously polishing both front and back surfaces of wafers will be demonstrated using a four-way double-side polishing apparatus in which the PCD of upper turn table load supporting points coincides with the PCD of carrier plate centers.

First, the wafers 24 are inserted into and held by the plurality of carrier plates 26 on which wafer holding holes are formed. Then, the wafers 24 held by the carrier plate 26 are sandwiched by the upper and lower turn tables 22 and 23, to which the polishing pads 25 are attached, using an elevating device (not shown) for causing the upper and lower turn tables 22 and 23 to advance or retreat along the rotational axis. Then, the upper turn table 22 is rotated by an upper rotation motor (not shown) via the cylinder 27 in a horizontal plane and the lower turn table 23 is rotated by a lower rotation motor (not shown) via the cylinder 27 in a horizontal plane while supplying slurry from the slurry supply means 34. By rotating and revolving the plurality of carrier plates 26 with the sun and internal gears 31 and 32 concurrently with the rotation of the upper and lower turn tables 22 and 23, it is possible to uniformly polish both front and back surfaces of the wafers.

At this time, neither rotation speeds nor rotation directions of the upper and lower turn tables nor pressing forces applied to the wafers by the upper and lower turn tables, etc. are limited, and polishing can be carried out in conventional polishing conditions.

Thus, by using a four-way double-side polishing apparatus and polishing the wafers with causing the PCD of upper turn table load supporting points that is the diameter of the circle joining the load supporting points of the upper turn table and the PCD of carrier plate centers that is the diameter of the circle joining centers of the plurality of carrier plates to coincide with each other, it is possible to improve responsiveness of turn table deformation to changes in polishing conditions. Therefore, by improving responsiveness of turn table deformation as described above for wafer polishing and by conducting wafer polishing while controlling polishing conditions such as the upper and/or lower turn table temperature, it is possible to conduct polishing while easily controlling wafer shape through the turn table shape deformation so as to compensate for variations in polished wafer shape associated with progress of polishing. This allows suppression of change in wafer shape over time and ensures good precision and stability in wafer shape control without deteriorating wafer shape even during polishing of a plurality of batches of wafers.

Figure 9:
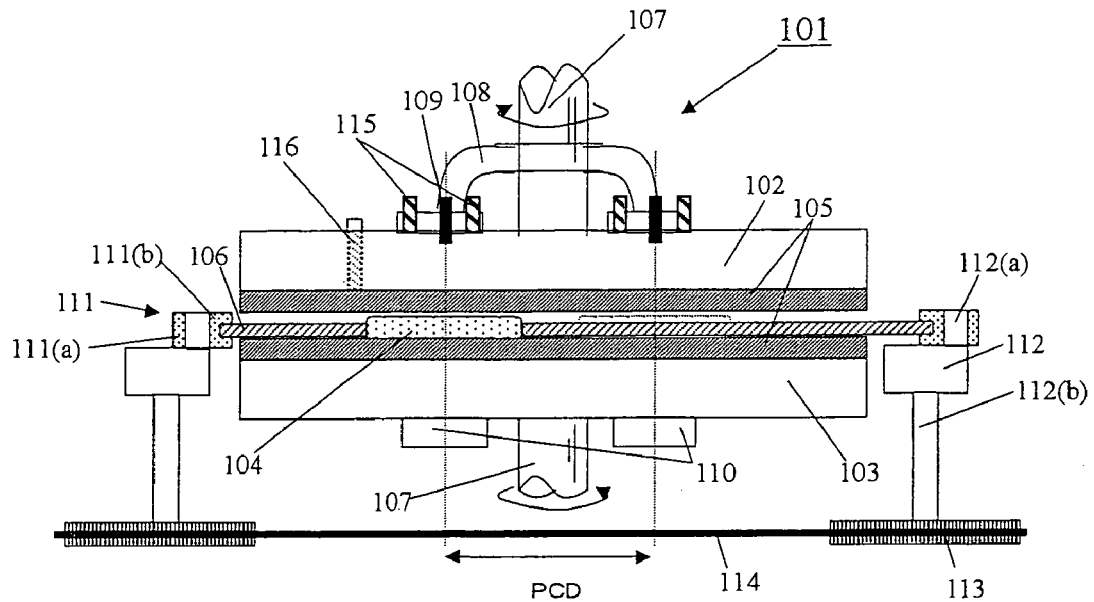
FIG. 9 illustrates a schematic sectional explanatory view showing an example of double-side polishing apparatus associated with a second embodiment of the present invention.

Next, an example of wafer double-side polishing apparatus associated with the second embodiment of the present invention will be described with reference to accompanying drawings. FIG. 9 illustrates a schematic sectional explanatory view of a double-side polishing apparatus associated with the second embodiment of the present invention.

A double-side polishing apparatus 101 has a carrier plate 106 with wafer holding holes, upper and lower turn tables 102 and 103 to which polishing pads 105 are attached and slurry supply means 116 for supplying slurry and can simultaneously polish both front and back surfaces of wafers 104 by inserting the wafers 104 into and holding them in the wafer holding holes on the carrier plate 106, sandwiching the wafers with the upper and lower turn tables 102 and 103 from above and below the wafers and rotating the upper and lower turn tables 102 and 103 on a rotational axis perpendicular to the wafers 104 while supplying slurry from the slurry supply means 116.

The upper turn table 102 is provided with a cylinder 107 for applying rotation and polishing loads, a housing 108 for transmitting those loads to the upper turn table 102 and fixing means 109 such as bolts for fixing the housing 108 and the upper turn table 102, and further equipped with temperature regulating means (not shown) therein for controlling the turn table temperature. Although the temperature regulating means are not specifically limited, they are designed to supply cooling and hot water into piping provided within the turn table.

The upper turn table 102 is held to the housing 108 by the fixing means 109 such as bolts, and a given load is applied to the upper turn table 102 during wafer polishing. For this reason, load supporting points of the upper turn table 102 are located on the fixing means 109 that are joining portions between the upper turn table 102 and the housing 108.

In the double-side polishing apparatus 101 of the present invention, it is possible to mechanically press and forcibly deform the upper turn table 102 by providing shape adjustment means 115 at load supporting point portions near the fixing means 109 that are load supporting points of the upper turn table 102, for example, at two points of perimeter and center sides of the fixing means 109 as shown in FIG. 9 and by adjusting the provided shape adjustment means 115. Thus, the double-side polishing apparatus of the present invention can forcibly and precisely control the shape of the upper turn table 102 during wafer polishing by adjusting the shape adjustment means 115 in accordance with changes in polishing ability and other factors of the polishing pads 105 over time, thus ensuring high precision and stability in wafer polishing.

At this time, although the shape adjustment means 115 are not specifically limited, it is preferred that the shape adjustment means 115 be, for example, micrometers. Thus, if the shape adjustment means are micrometers, it is possible to mechanically press the upper turn table by a desired magnitude and to forcibly deform the upper turn table through accurate adjustment of the micrometers, allowing precise deformation of the turn table into a desired shape.

On the other hand, the lower turn table 103 is provided with the cylinder 107 for imparting rotation from a motor and a speed reducer (not shown) to the lower turn table and thrust bearings 110 that support the load of the turn tables. The lower turn table 103 is also equipped with temperature regulating means therein that are not shown for controlling the turn table temperature as with the upper turn table.

It is preferred that materials of the upper and lower turn tables 102 and 103 be stainless steel (SUS). Thus, if the turn tables are made of stainless steel (SUS), it is possible to properly deform the turn tables, allowing easy deformation of the turn tables with the shape adjustment means, etc. Although types and materials of the polishing pads 105, attached to the under surface of the upper turn table 102 and the top surface of the lower turn table 103 for mirror-polishing front and back surfaces of the wafers, are not limited, hard polyurethane foam pads and soft non-woven cloth pads made by hardening polyurethane-resin-impregnated non-woven cloth, which are ordinary polishing pads, are among usable pads, for example. As soft non-woven cloth, Suba600 manufactured by Rodel Inc. is employed, for example. In addition, polishing pads of two or more layers made by foaming polyurethane resin on top of a base cloth made of non-woven cloth can also be used.

The slurry supply means 116 are constituted by providing slurry supply holes on the upper turn table via a rotary joint (not shown) and can change slurry supply amount, for example, by a solenoid valve that is not shown and the like. The plurality of slurry supply means can be formed, and it is preferred that the slurry supply means be arranged in an area in the form of an annular ring of a given width in which the wafers always exist such that slurry is constantly supplied to the wafer surfaces even if the carrier plate performs a swinging motion.

The carrier plate 106 has, for example, five wafer holding holes formed on a disk-shaped plate and can hold the wafers 104 so as to be rotatable in the wafer holding holes. Although the material and other properties of the carrier plate 106 are not specifically limited, it is preferred that the carrier plate 106 made, for example, of glass epoxy be used.

The perimeter portion of the carrier plate 106 is held by an annular portion 111(b) of a carrier holder 111, causing the carrier plate 106 to make a circular motion in a plane (horizontal plane) parallel to the surface of the carrier plate without the carrier plate itself rotating. The perimeter of the annular portion 111(b) of the carrier holder 111 is provided with a plurality of bearing portions 111(a) projecting outward. An eccentric shaft 112(a) of an eccentric arm 112 in the form of a small-diameter disk is attached by insertion to each of the bearing portions 111(a) of the carrier holder, with a rotary shaft 112(b) installed vertically at a central portion of each of the under surfaces of the eccentric arm 112. Further, a sprocket 113 is fastened to the end of each of the rotary shafts 112(b), with a timing chain 114 being stretched among each of the sprockets 113 in a horizontal state in a serial manner. The sprockets 113 and the timing chain 114 together constitute synchronization means for rotating the plurality of eccentric arms 112 synchronously.

Rotation is imparted to one of the sprockets 113 by operating a circular motion motor (not shown) connected to one of the sprockets 113. As a result of rotation of the timing chain 114 via the sprocket 113 and cyclic motion of the timing chain, the plurality of eccentric arms 112 rotate in synchronization on the rotary shafts 112(b) in a horizontal plane. This allows the carrier holder 111 coupled to each of the eccentric arms 112 and the carrier plate 106 held by the carrier holders 111 to make a circular motion that is a circling taking place eccentrically from the rotational axis of the upper and lower turn tables 102 and 103, in a horizontal plane parallel to the carrier plate, by the same distance as that between the eccentric shaft 112(a) and the rotary shaft 112(b) in the eccentric arm 112.

Thus, by causing the carrier plate 106 to make a circular motion not accompanied by the rotation of the carrier plate, all points on the carrier plate 106 trace a small circular trajectory of the same size, allowing uniform polishing across both front and back surfaces of the wafers 104 held by the carrier plate 106.

In such the double-side polishing apparatus 101, it is preferred that a PCD (Pitch Circle Diameter) of upper turn table load supporting points that is a diameter of a circle joining the load supporting points of the upper turn table 102 coincide with a PCD of centers of the wafer holding holes on the carrier plate that is a diameter of a circle joining the each center of wafer holding holes on the carrier plate 106.

More specifically, load supporting points of the upper turn table 102 in the double-side polishing apparatus 101 are located on the fixing means 109 that are joining portions between the upper turn table 102 and the housing 108 as described above. Consequently, the PCD of upper turn table load supporting points can be expressed by the diameter of the circle (pitch circle) joining the centers of the fixing means 109 that are the load supporting points of the upper turn table. The PCD of centers of wafer holding holes on the carrier plate 106 can be, in the case of a double-side polishing apparatus with the single carrier plate 6 as described above, expressed by the diameter of the pitch circle joining the centers of the wafer holding holes (the centers roughly coincide with wafer centers of the wafers 104 held by the carrier plate 106) formed on the carrier plate 106.

It is possible, by causing the PCD of upper turn table load supporting points and the PCD of centers of the wafer holding holes on the carrier plate to coincide with each other, to improve responsiveness of turn table deformation (particularly, linearity) to adjustments of polishing slurry supply amount and the shape adjustment means during wafer polishing, and thereby making the double-side polishing apparatus capable of stable wafer polishing while controlling polished wafer shape with high precision.

It is possible to cause the PCD of upper turn table load supporting points and the PCD of centers of the wafer holding holes on the carrier plate to coincide with each other in design stage of double-side polishing apparatus by adjusting the upper turn table and the carrier plate. As for existing double-side polishing apparatuses, it is possible and convenient to cause the PCD of upper turn table load supporting points and the PCD of centers of the wafer holding holes on the carrier plate to coincide with each other in carrier plate manufacture stage by adjusting the positions of wafer holding holes.

At this time, it is important to cause the PCD of upper turn table load supporting points and the PCD of centers of the wafer holding holes on the carrier plate to coincide with each other, and it is preferred that these pitch circles be located at the same position during polishing. However, if the carrier plate 106 of the double-side polishing apparatus 101 makes a circular motion that is a circling taking place eccentrically from the rotational axis of the upper and lower turn tables as described above, although the diameter of the pitch circle formed by load supporting points of the upper turn table coincides with that formed by centers of wafer holding holes of the carrier plate, the position of the pitch circle of centers of wafer holding holes on the carrier plate 106 changes over time during polishing. Therefore, it is impossible to ensure a constant coincidence between the pitch circle of turn table load supporting points and the pitch circle of centers of the wafer holding holes on the carrier plate. In this case, consequently, it suffices to cause the pitch circle of upper turn table load supporting points and the circle joining the average position of small circular trajectories of centers of wafer holding holes on the carrier plate (wafer centers of wafers held by the carrier plate) to coincide with each other, and coincidence of PCDs as referred to in the present invention includes coincidence of diameters and coincidence of such pitch circle positions.

For coincidence of the PCD of upper turn table load supporting points with the PCD of centers of the wafer holding holes on the carrier plate (wafer centers of wafers held by the carrier plate) described above, it suffices to cause the PCDs to coincide with each other, including diameters and pitch circle positions, within a tolerance of 5 mm or less. While a perfect coincidence is preferred between the PCD of upper turn table load supporting points and the PCD of centers of the wafer holding holes on the carrier plate, it is only natural that a certain amount of tolerance actually occurs. In consideration of eccentricity during polishing, it is possible to improve sufficiently responsiveness of turn table deformation to changes in polishing conditions by achieving a coincidence within a tolerance of 5 mm or less. That is, coincidence of the PCDs as referred to in the present invention may include cases in which such a certain amount of tolerance exists.

Next, a method for simultaneously polishing both front and back surfaces of wafers will be demonstrated using the double-side polishing apparatus 101 shown in FIG. 9.

First, the wafers 104 are inserted into and held by the carrier plate 106 on which the wafer holding holes are formed. Then, the wafers 104 held by the carrier plate 106 are sandwiched by the upper and lower turn tables 102 and 103, to which the polishing pads 105 are attached, using an elevating device (not shown) for causing the upper and lower turn tables 102 and 103 to advance or retreat along the rotational axis. Then, the upper turn table 102 is rotated by an upper rotation motor (not shown) via the cylinder 107 in a horizontal plane and the lower turn table 103 is rotated by a lower rotation motor (not shown) via the cylinder 107 in a horizontal plane while supplying slurry from the slurry supply means 116. At this time, the wafers 104 are held in the wafer holding holes on the carrier plate 106 so as to be rotatable, allowing the wafers 104 to turn together (rotate) in the direction of rotation of the faster rotating turn table by adjusting the rotation speeds of the upper and lower turn tables 102 and 103. At the same time the upper and lower turn tables 102 and 103 are rotated, the carrier plate 106 is caused to make a circular motion not accompanied by its rotation by the carrier holders 111 to which the eccentric arms 112 are attached by insertion. Thereby, it is possible to polish uniformly both front and back surfaces of the wafers 104 simultaneously.

At this time, neither rotation speeds of the upper and lower turn tables 102 and 103 nor their rotation directions nor pressing forces applied to the wafers 104 by the upper and lower turn tables 102 and 103 are limited. It is preferred that pressing on front and back surfaces of the silicon wafers by the upper and lower turn tables be applied by a pressure application method via a fluid, etc. Pressure is applied primarily by a housing portion arranged on the upper turn table. Normally, pressing forces applied to the wafers by the upper and lower turn tables are 100 to 300 g/cm$^2$. At this time, polishing amount and polishing speed in front and back surfaces of the wafers are not limited.

Thus, by adjusting amount of slurry supplied from the slurry supply means 116 during simultaneous polishing of both front and back surfaces of the wafers, it is possible to control polishing surface temperature, thus allowing polishing wafers while controlling the turn table shape with excellent responsiveness.

Although slurry supply amount supplied from the slurry supply means is not limited since the amount varies depending on conditions of the carrier plate size and the like, the amount is normally 2.0 to 6.0 liters/min. At this time, it is possible to control polishing surface temperature during polishing and control the turn table shape with excellent responsiveness by adjusting slurry supply amount. This ensures stable polishing without deteriorating wafer shape. At this time, although type of slurry used is not limited, alkali solution with pH 9 to 11 containing colloidal silica can be used, for instance, for polishing of silicon wafers.

At this time, it is preferred that slurry supply amount be adjusted in accordance with usage time of the polishing pads. This ensures good precision in the turn table shape control in accordance with changes in polishing ability and other factors of polishing pads over time. For instance, it suffices to adjust slurry supply amount such that supply amount is reduced over time with increasing usage time of the polishing pads to maintain wafer shape within a range up to a control target value, and the rate is set as appropriate according to the polishing apparatus and the polishing conditions used. For example, by adjusting slurry supply amount such that supply amount is reduced by about 0.2 liters/min each time after polishing of five batches of wafers, it is possible to deform the turn table shape so as to compensate for variations in wafer shape associated with progress of polishing, thus allowing polishing while easily controlling wafer shape. This allows suppression of change in wafer shape over time and ensures good precision in wafer shape control and stability in polishing without deteriorating wafer shape during polishing of a plurality of batches of wafers.

By providing shape adjustment means at the load supporting point portions of the upper turn table and conducting polishing while controlling the turn table shape through adjustment of the shape adjustment means during simultaneous polishing of both front and back surfaces of the wafers as described above, it is possible to forcibly deform the upper the turn table shape with the shape adjustment means, allowing proper the turn table shape control in accordance with change in wafer shape over time.

For instance, as shown in FIG. 10(a), the micrometers exemplified above are provided as the shape adjustment means 115 at two points of perimeter and center sides of the fixing means 109 that are load supporting points of the upper turn table 102, and the two micrometers provided at load supporting point portions are adjusted in order that the micrometer provided on the perimeter side of the fixing means 109 may be loosened upward and the other micrometer provided on the center side may be pressed downward, so that it is possible to control the shape of the upper turn table 102 into a downwardly convex shape as shown in FIG. 10(b). Conversely, by adjusting the micrometers in order that the micrometer provided on the perimeter side of the fixing means 109 may be pressed downward and the other micrometer provided on the center side may be loosened upward, it is possible to control the shape of the upper turn table 102 into an upwardly convex shape as shown in FIG. 10(c).

At this time, micrometer adjustment amount is determined by clarifying in advance the relationship between polishing conditions such as polishing temperature and change in wafer shape. By properly adjusting the micrometers based on the relationship between polishing conditions and wafer shape, it is possible to deform the turn table shape so as to compensate for variations in wafer shape associated with progress of polishing, thus allowing polishing while easily controlling wafer shape. This allows suppression of change in wafer shape over time and ensures good precision in wafer shape control and stability in polishing without deteriorating wafer shape during polishing of a plurality of batches of wafers.

Further at this time, it is preferred that, the wafers be polished with causing the PCD of upper turn table load supporting points that is the diameter of the circle joining the load supporting points of the upper turn table and the PCD of wafer centers that is the diameter of the circle joining centers of the wafers held by the carrier plate to coincide with each other. Thus, by causing the PCD of upper turn table load supporting points and the PCD of wafer centers to coincide with each other, it is possible to improve further responsiveness of turn table shape control by the adjustment of slurry supply amount and the adjustment of the shape adjustment means, thus ensuring high precision in the turn table shape control. Therefore, it is possible to control the turn table shape precisely so as to compensate for changes in wafer shape over time associated with progress of polishing, thus enabling polishing while easily controlling wafer shape. Consequently, it is possible to maintain wafer shape precisely and polish the wafers stably even during repeated polishing of a plurality of batches of wafers.

To evaluate responsiveness of turn table deformation to change in (adjustment of) slurry supply amount and responsiveness of turn table deformation to adjustment of the shape adjustment means, the results of experiments in relation to wafer shape responsiveness (linearity in particular) will be shown below that were conducted by polishing wafers under variation of slurry supply amount or adjustment of the shape adjustment means.

The double-side polishing apparatus shown in FIG. 9 was used as wafer double-side polishing apparatus. In the double-side polishing apparatus, the PCD of upper turn table load supporting points and the PCD of centers of the wafer holding holes on the carrier plate were coincident at 600 mm. The average position of pitch circles formed by centers of wafer holding holes on the carrier plate and the position of the pitch circle formed by load supporting points of the upper turn table were caused to coincide with each other when the carrier plate performs circular motion not accompanied by its rotation. Micrometers were provided as the shape adjustment means 115 at two points of perimeter and center sides of the fixing means 109 that are load supporting points of the upper turn table 102 to forcibly deform the turn table shape.

Using the double-side polishing apparatus, five silicon wafers having diameter of 300 mm (one batch) were first inserted into respective wafer holding holes of the carrier plate (carrier plate having five wafer holding holes) so as to be rotatable. Each wafer was pressed at 200 g/cm² by the upper and lower turn tables to which soft non-woven cloths (polishing pads) were attached.

Then, both front and back surfaces of the wafers were polished, with the upper and lower polishing pads pressed against front and back surfaces of the wafers, by rotating the upper and lower turn tables while supplying slurry from the upper turn table side and by causing the carrier plate to make a circular motion (circular motion of about 10 cm in diameter) not accompanied by the rotation of the carrier plate through cyclic motion of the timing chain using a circular motion motor. Note that the slurry used was that in which polishing abrasive grain consisting of colloidal silica of 0.05 μm in grain size was dispersed in alkali solution with pH 10.5.

(Responsiveness of Turn Table Deformation to Change in (Adjustment of) Slurry Supply Amount)

In order to evaluate responsiveness of turn table deformation to change in (adjustment of) slurry supply amount, slurry supply amount was varied in five steps at equal intervals for examination of responsiveness of wafer shape to change in slurry supply amount. Slurry supply amount in experimental condition 1 was actually set to 3.0 liters/min, with the amount increased each time by 0.2 liters/min in each of experimental conditions 2 to 5, to examine the change in wafer shape (the change in the turn table shape) according to change in slurry supply amount. At this time, other conditions were kept unchanged to the extent possible. For polishing pads in particular, the pads with similar usage times were used for the experiment.

In this case, while responsiveness of turn table deformation may be evaluated by direct observation of change in the turn table shape, the shape of polished wafer is actually important. In the present experiment, for this reason, responsiveness of wafer shape to change in slurry supply amount was evaluated by measuring unevenness of wafers after polishing and confirming thicknesses at the center and perimeter portions as parameters representing wafer shape. In this measurement, variations were relatively evaluated by using the shape of experimental condition 3 as reference and treating the shapes more convex as positive and those more concave as negative.

(Responsiveness of the Turn Table Shape to Adjustment of the Shape Adjustment Means)

In order to evaluate responsiveness of the turn table shape to adjustment of the shape adjustment means, wafers were polished under five varying conditions of the turn table shape by adjusting upwardly or downwardly the micrometer on the perimeter side and that on the center side provided near the housing in the upper turn table.

Using the state in experimental condition 3 (the micrometer at the perimeter side set at the same height as that on the center side) as reference, the state in which the micrometer on the perimeter side was upward loosened was treated as experimental condition 2, and the state in which the micrometer on the center side was furthermore pressed downward was treated as experimental condition 1. Conversely, using experimental condition 3 as reference, the state in which the micrometer on the center side was upward loosened was treated as experimental condition 4, and the state in which the micrometer on the perimeter side was furthermore pressed downward was treated as experimental condition 5. Namely, the upper the turn table shape was controlled so as to be downwardly convex in experimental conditions 1 and 2 as shown in FIG. 10(b) and upwardly convex in experimental conditions 4 and 5 as shown in FIG. 10(c) to confirm change in wafer shape to adjustment of the shape adjustment means.

At this time, other conditions were kept unchanged to the extent possible. For polishing pads in particular, the pads with similar usage times were used for the experiment. Responsiveness of wafer shape to adjustment of the shape adjustment means was evaluated by measuring, as a parameter representing wafer shape, unevenness of wafers after polishing as was done in the previous evaluation.

Figure 12:
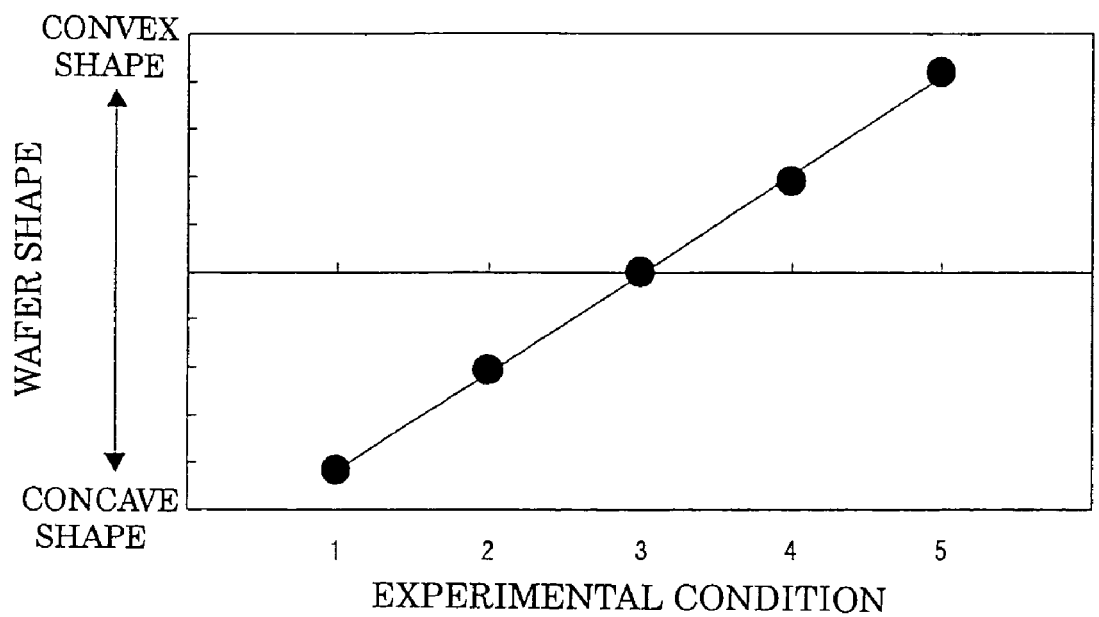
FIG. 12 illustrates a graph showing wafer shape responsiveness to change in slurry supply amount.
Figure 13:
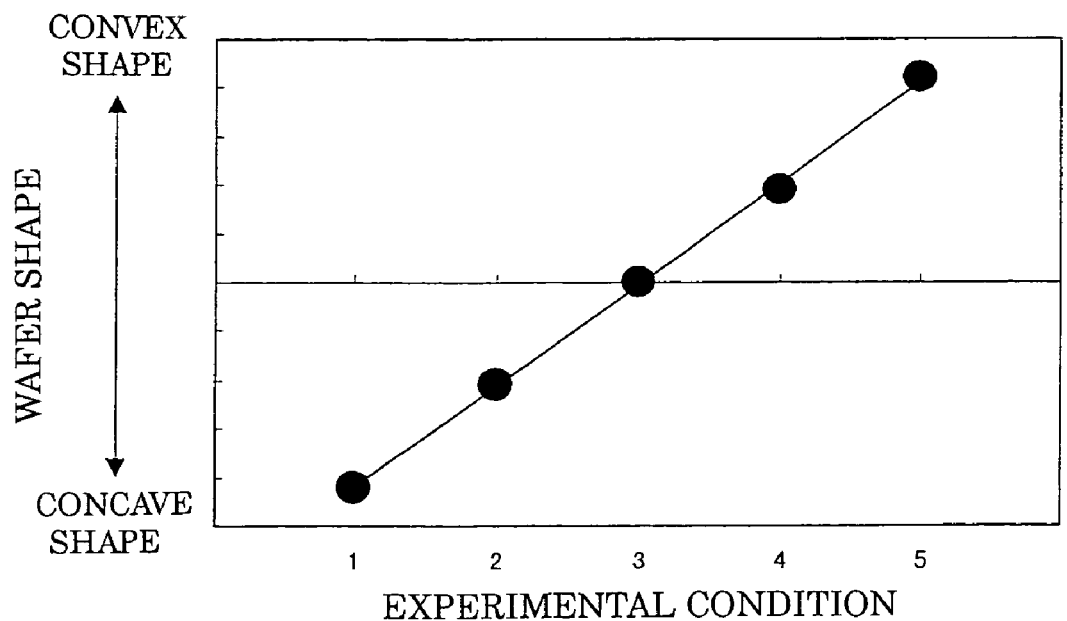
FIG. 13 illustrates a graph showing wafer shape responsiveness to adjustment of the shape adjustment means.

FIG. 12 shows measurement results of wafer shape responsiveness to change in slurry supply amount and FIG. 13 shows measurement results of wafer shape responsiveness to adjustment of the shape adjustment means. The measurement results are plotting of average values of five wafers (one batch) in each experimental condition. When slurry supply amount is changed, it is apparent as shown in FIG. 12 that the linearity is good (correlation coefficient: 0.998) and that the responsiveness of wafer shape (that is, responsiveness of turn table deformation) to change in slurry supply amount is good. When the shape adjustment means are adjusted, it is also apparent as shown in FIG. 13 that the linearity is good (correlation coefficient: 0.995) and that the responsiveness of wafer shape (that is, responsiveness of turn table deformation) to change in the shape adjustment means is good.

From the experimental results, it is clear that the responsiveness of turn table deformation to adjustment of slurry supply amount or of the shape adjustment means is very good. Therefore, it is possible to perform polishing stably with high precision without deteriorating wafer shape, for example, by adjusting slurry supply amount or the shape adjustment means in consideration of wafer shape responsiveness (linearity) shown in FIGS. 12 and 13 so as to compensate for variations in wafer shape arising as a result of continuous and repeated polishing with the same polishing pads.

While adjustment of slurry supply amount and the shape adjustment means contributes to precision in the turn table shape control even if conducted separately, adjustment of both, furthermore in conjunction with adjustment of the turn table temperature with the temperature regulating means in the turn tables, permit more precise and easy control in the turn table shape. This ensures higher precision in wafer shape control and more stability in polishing. This also allows maintaining of batch-by-batch wafer shape with extremely high precision and ensures stable polishing even during repeated polishing of a plurality of batches of wafers.

The turn table shape control through adjustment of slurry supply amount and adjustment of the shape adjustment means may be conducted every polishing batch or in the middle of polishing. Normally, it is possible to sufficiently control wafer shape by making adjustment every polishing batch. It is possible that, for example, wafer shape is examined after polishing of several batches of wafers, and the turn table shape is controlled through adjustment of slurry supply amount and/or adjustment of the shape adjustment means in accordance with change in wafer shape over time, followed by performing polishing of a next batch.

Figure 11:
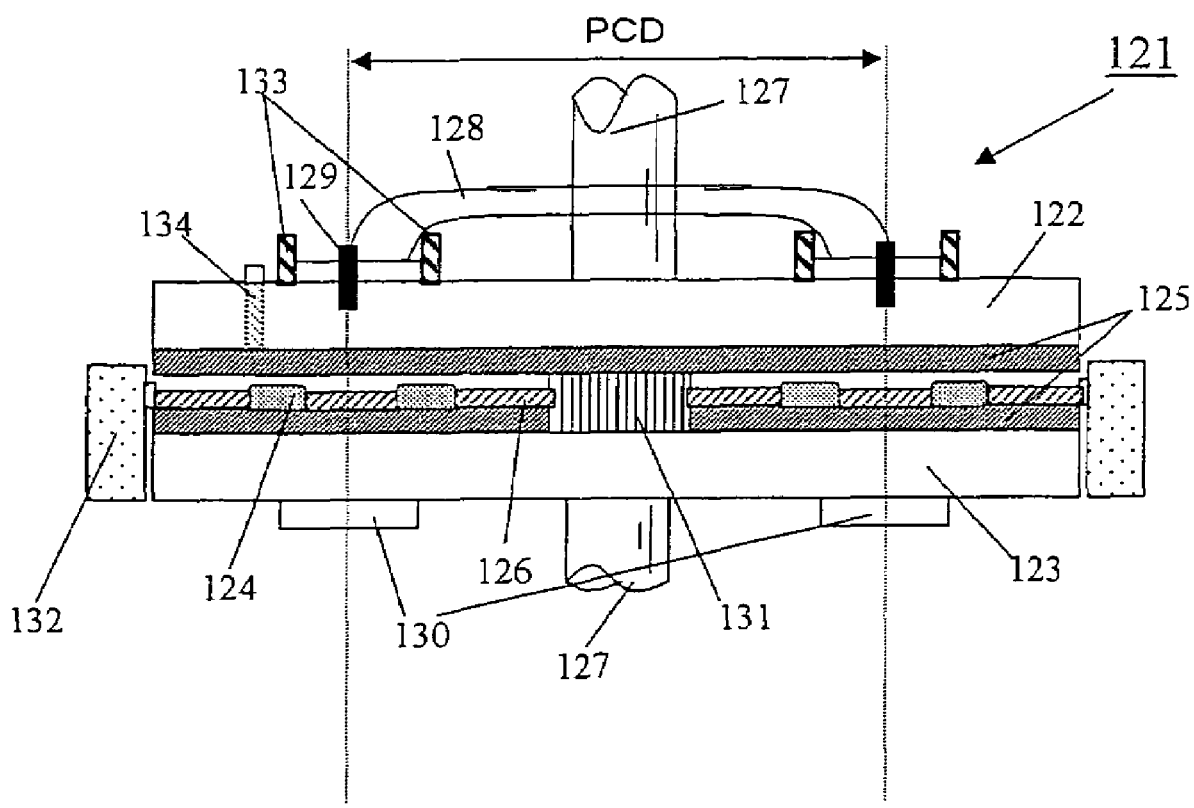
FIG. 11 illustrates a schematic sectional explanatory view showing an example of another form of (four-way) double-side polishing apparatus associated with the second embodiment of the present invention.

Next, another form of double-side polishing apparatus associated with the second embodiment of the present invention will be described. FIG. 11 illustrates a schematic sectional explanatory view of a four-way double-side polishing apparatus in accordance with the present invention.

A four-way double-side polishing apparatus 121 has a plurality of carrier plates 126 with wafer holding holes, sun and internal gears 131 and 132 for rotating and revolving the carrier plates, upper and lower turn tables 122 and 123 to which polishing pads 125 are attached and a slurry supply means 134, and can simultaneously polish both front and back surfaces of wafers 124 by inserting the wafers 124 into and holding them in the wafer holding holes on the plurality of carrier plates 126, sandwiching the carrier plates 126 with the upper and lower turn tables 122 and 123, to which the polishing pads 125 are attached, from above and below the carrier plates, rotating and revolving the carrier plates 126 with the sun and internal gears 131 and 132 while supplying slurry from the slurry supply means and rotating the upper and lower turn tables 122 and 123 on a rotational axis perpendicular to the wafers 124.

At this time, the upper turn table 122 is provided with a cylinder 127 for applying rotation and polishing loads, a housing 128 for transmitting those loads to the upper turn table and fixing means 129 such as bolts for fixing the housing 128 and the upper turn table 122 and further equipped with temperature regulating means (not shown) therein for controlling the turn table temperature.

Load supporting points of the upper turn table 122 are located on the fixing means 129 that are joining portions between the upper turn table 122 and the housing 128. In the double-side polishing apparatus 121 of the present invention, it is possible to mechanically press and forcibly deform the upper turn table 122 by providing shape adjustment means 133 at load supporting point portions near the fixing means 129 that are load supporting points of the upper turn table 122, for example, at two points of perimeter and center sides of the fixing means 129 as shown in FIG. 11 and by adjusting the provided shape adjustment means 133. Thus, the double-side polishing apparatus of the present invention can forcibly and precisely control the shape of the upper turn table 122 during wafer polishing by adjusting the shape adjustment means 133 in accordance with changes in polishing ability and other factors of the polishing pads 125 over time, thus ensuring high precision and stability in wafer polishing.

At this time, although the shape adjustment means 133 are not specifically limited, it is preferred that the shape adjustment means 133 be, for example, micrometers. Thus, if the shape adjustment means are micrometers, it is possible to mechanically press the upper turn table by a desired magnitude and to forcibly deform the upper turn table through accurate adjustment of the micrometers, allowing precise deformation of the turn table into a desired shape.

On the other hand, the lower turn table 123 is provided with the cylinder 127 for imparting rotation from a motor and a speed reducer (not shown) to the lower turn table and thrust bearings 130 that support the load of the turn tables. The lower turn table 123 is also equipped with temperature regulating means (not shown) therein for controlling the turn table temperature.

It is preferred that materials of the upper and lower turn tables 122 and 123 be stainless steel (SUS), allowing easy deformation of the turn tables with the shape adjustment means, etc. Although the polishing pads 125 attached to the under surface of the upper turn table 122 and the top surface of the lower turn table 123 are not limited, hard polyurethane foam pads and soft non-woven cloth pads made by hardening polyurethane-resin-impregnated non-woven cloth, which are ordinary polishing pads, are among usable pads as described above.

The slurry supply means 134 are constituted by providing slurry supply holes on the upper turn table via a rotary joint (not shown) and can change slurry supply amount, for example, by a solenoid valve that is not shown and the like. A plurality of slurry supply means can be formed, and it is preferred that the slurry supply means be arranged such that slurry is constantly supplied to the wafer surfaces.

In such the double-side polishing apparatus 121, it is preferred that a PCD of upper turn table load supporting points that is a diameter of a circle joining the load supporting points of the upper turn table 122 coincide with a PCD of carrier plate centers that is a diameter of a circle joining the centers of the plurality of carrier plates 126.

More specifically, load supporting points of the upper turn table 122 in the double-side polishing apparatus 121 are located on the fixing means 129 that are joining portions between the upper turn table 122 and the housing 128 as described above. Consequently, the PCD of upper turn table load supporting points can be expressed by the diameter of the circle joining the centers of the fixing means 129 that are the load supporting points of the upper turn table. Since a plurality of wafer holding holes are formed on the carrier plates 126 in the double-side polishing apparatus 121, it is difficult to cause the PCD of centers of the wafer holding holes that is the average diameter of the circle joining the centers of wafer holding holes on the carrier plates 126 to coincide with the PCD of upper turn table load supporting points. In the case of the double-side polishing apparatus 121, for this reason, the PCD of carrier plate centers that is the diameter of the circle joining the centers of the plurality of carrier plates 126 is caused to coincide with the PCD of upper turn table load supporting points. Thereby, it is possible to improve responsiveness of turn table deformation (in particular, linearity) to adjustments of slurry supply amount, adjustments of the shape adjustment means, etc. during wafer polishing, thus making the double-side polishing apparatus in which it is possible to polish wafers stably while controlling wafer shape to be polished with high precision.

At this time, while a perfect coincidence is preferred between the PCD of upper turn table load supporting points and the PCD of carrier plate centers, it suffices to achieve a coincidence within a tolerance of 5 mm or less as mentioned earlier, improving responsiveness of turn table deformation to adjustment of polishing conditions. The present invention includes cases in which such a certain amount of tolerance exists.

Next, a method for simultaneously polishing both front and back surfaces of wafers will be demonstrated using the four-way double-side polishing apparatus shown in FIG. 11.

First, the wafers 124 are inserted into and held by the plurality of carrier plate 126 on which the wafer holding holes are formed. Then, the wafers 124 held by the carrier plates 126 are sandwiched by the upper and lower turn tables 122 and 123, to which the polishing pads 125 are attached, using an elevating device (not shown) for causing the upper and lower turn tables 122 and 123 to advance or retreat along the rotational axis. Then, the upper turn table 122 is rotated by an upper rotation motor (not shown) via the cylinder 127 in a horizontal plane and the lower turn table 123 is rotated by a lower rotation motor (not shown) via the cylinder 127 in a horizontal plane while supplying slurry from the slurry supply means 134. By rotating and revolving the plurality of carrier plates 126 with the sun and internal gears 131 and 132 concurrently with the rotation of the upper and lower turn tables 122 and 123, it is possible to uniformly polish both front and back surfaces of the wafers.

At this time, neither rotation speeds nor rotation directions of the upper and lower turn tables nor pressing forces applied to the wafers by the upper and lower turn tables, etc. are limited, and polishing can be carried out in conventional polishing conditions.

By adjusting amount of slurry supplied from the slurry supply means 134 during simultaneous polishing of both front and back surfaces of the wafers, it is possible to control polishing surface temperature, and thereby, the wafers can be polished stably without deteriorating wafer shape while controlling the turn table shape with excellent responsiveness. In this case, type of slurry used is not limited as mentioned earlier.

At this time, it is preferred that slurry supply amount be adjusted in accordance with usage time of the polishing pads. This ensures good precision in the turn table shape control in accordance with changes in polishing ability and other factors of polishing pads over time. For instance, it suffices to adjust slurry supply amount such that supply amount is reduced over time with increasing usage time of the polishing pads, and the rate is set as appropriate according to the polishing apparatus and the polishing conditions used. Thus, by adjusting slurry supply amount in accordance with usage time of the polishing pads, it is possible to deform the turn table shape so as to compensate for variations in wafer shape associated with progress of polishing, thus enabling polishing while easily controlling wafer shape. Further, even during polishing of a plurality of batches of the wafers, change in wafer shape over time can be suppressed and it is possible to polish the wafers stably while controlling wafer shape with good precision without deteriorating wafer shape.

Figure 10:
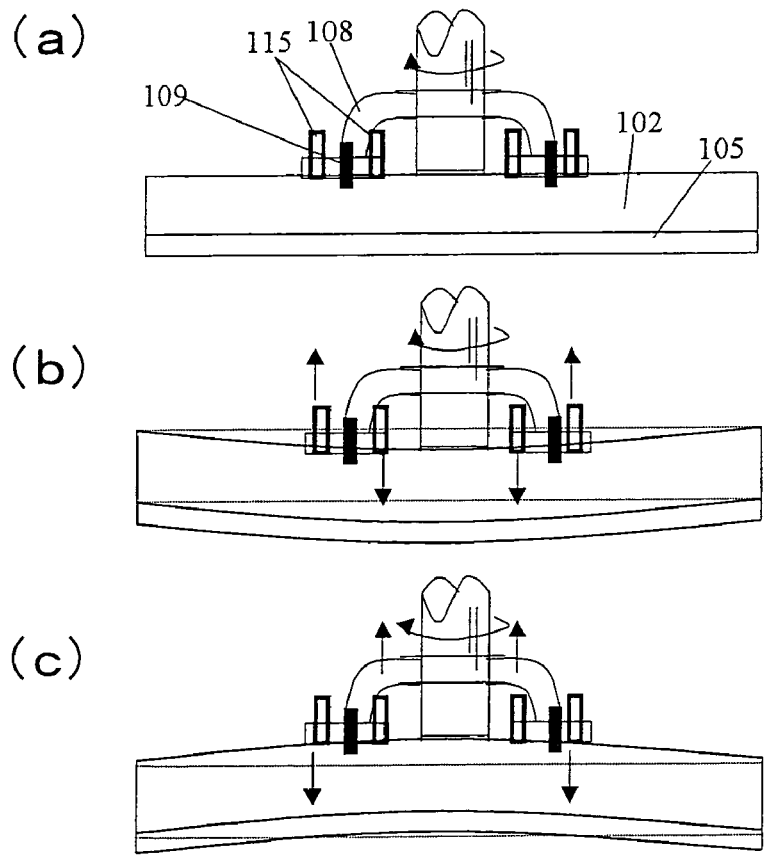
FIG. 10 illustrates a schematic explanatory view showing deformation of the upper turn table through adjustment of shape adjustment means.

On the other hand, wafer polishing is conducted while controlling the turn table shape by providing the shape adjustment means 133 at load supporting point portions of the upper turn table 122 and adjusting the shape adjustment means 133 during simultaneous polishing of both front and back surfaces of the wafers as described above. This makes it possible to forcibly deform the upper turn table shape with the shape adjustment means, for example, as shown in FIGS. 10(*b*) and 10(*c*). By clarifying in advance a relationship between polishing conditions such as polishing temperature and change in wafer shape and properly adjusting the micrometers based on the relationship, it is possible to deform the turn table shape so as to compensate for variations in wafer shape associated with progress of polishing, thus allowing polishing while easily controlling wafer shape. Further, even during polishing of a plurality of batches of the wafers, change in wafer shape over time can be suppressed and it is possible to polish the wafers stably while controlling wafer shape with good precision without deteriorating wafer shape.

Further at this time, it is preferred that the wafers be polished with causing the PCD of upper turn table load supporting points that is the diameter of the circle joining the load supporting points of the upper turn table 122 and the PCD of carrier plate centers that is the diameter of the circle joining the centers of the plurality of carrier plates to coincide with each other. Thus, by causing the PCD of upper turn table load supporting points and the PCD of carrier plate centers to coincide with each other, it is possible to improve responsiveness of the turn table shape control to adjustment of slurry supply amount and adjustment of the shape adjustment means, thus ensuring high precision in the turn table shape control. Consequently, it becomes possible to precisely control the turn table shape so as to compensate for variations over time in wafer shape associated with progress of polishing, thus allowing polishing while controlling wafer shape more easily. Thereby, it is possible to maintain wafer shape with good precision and to perform polishing stably even during repeated polishing of a plurality of batches of wafers.

At this time, the responsiveness of turn table deformation to change in (adjustment of) slurry supply amount and adjustment of the shape adjustment means is very good as with the double-side polishing apparatus 101. Consequently, it is possible to perform polishing stably with high precision without deteriorating wafer shape, for example, by adjusting slurry supply amount or the shape adjustment means in consideration of responsiveness of wafer shape (linearity) so as to compensate for variations in wafer shape arising as a result of continuous and repeated polishing with the same polishing pads.

Further, adjustment of slurry supply amount and the shape adjustment means together and adjustment of both in conjunction with adjustment of the turn table temperature with the temperature regulating means provided in the turn table permit more precise and easy control in the turn table shape. This allows maintaining of batch-by-batch wafer shape with extremely high precision and ensures stability in polishing even during repeated polishing of a plurality of batches of wafers.

It should be understood that the turn table shape control through adjustment of slurry supply amount and adjustment of the shape adjustment means may be conducted every polishing batch or in the middle of polishing as with the above.

The present invention will be explained more specifically as described in the examples and comparative examples below, but the present invention is not limited thereto.

First, to evaluate responsiveness of turn table deformation according to changes in polishing conditions when the wafer double-side polishing apparatus of the present invention and a conventional wafer double-side polishing apparatus are used, experiments were conducted in relation to responsiveness of wafer shape, and particularly linearity.

EXAMPLE 1

A double-side polishing apparatus was used in which the PCD of upper turn table load supporting points and the PCD of centers of the wafer holding holes on the carrier plate (centers of wafers held by the carrier plate) were coincident at 600 mm and in which the carrier plate performed a circular motion not accompanied by its rotation, with the average position of pitch circles formed by centers of wafer holding holes on the carrier plate coincident with the position of pitch circle formed by load supporting points of the upper turn table during polishing, as shown in FIG. 1.

Using the double-side polishing apparatus, five silicon wafers having diameter of 300 mm (one batch) were first inserted into respective wafer holding holes of the carrier plate (carrier plate having five wafer holding holes) so as to be rotatable. Each wafer was pressed at 200 g/cm² by the upper and lower turn tables to which soft non-woven cloths (polishing pads) were attached.

Then, the upper and lower turn tables were rotated, with the upper and lower polishing pads pressed against front and back surfaces of the wafers, and the timing chain was caused to perform an cyclic motion using a circular motion motor while supplying slurry from the upper turn table side. This allowed each of the eccentric arms to rotate in synchronization in a horizontal plane, causing the carrier holder coupled to each eccentric shaft and the carrier plate to perform a circular motion (circular motion of about 10 cm in diameter) not accompanied by their rotation in a horizontal plane parallel to the surface of the carrier plate, so that both front and back surfaces of the wafers were polished. Note that the slurry used was that in which polishing abrasive grain consisting of colloidal silica of 0.05 μm in grain size was dispersed in alkali solution with pH 10.5.

In example 1, responsiveness of wafer shape was examined under varying polishing conditions during the above polishing process, by varying the cooling water temperature in the turn tables at equal intervals. The change in wafer shape (change in the turn table shape) to temperature change was actually confirmed by setting the cooling water temperature to 22° C. in polishing condition 1 and increasing the temperature to 30° C. in steps of 2° C. (polishing conditions 1 to 5).

At this time, responsiveness of wafer shape to changes in polishing conditions was evaluated by measuring unevenness in wafers, as parameters representing wafer shape, and confirming thicknesses at the center and perimeter portions. Variations were relatively evaluated by using the shape of experimental condition 3 as reference and treating the shapes more convex as positive and those more concave as negative.

COMPARATIVE EXAMPLE 1

For comparison, a conventional double-side polishing apparatus as shown in FIG. 5 was used in which the PCD of upper turn table load supporting points and the PCD of centers of the wafer holding holes on the carrier plate (centers of wafers held by the carrier plate) were respectively set to 600 mm and 640 mm and in which the carrier plate performed a circular motion not accompanied by its rotation to polish both front and back surfaces of the wafers. Wafers were polished under same conditions as example 1 except for that (in particular, the polishing pads with similar usage times were used).

Figure 6:
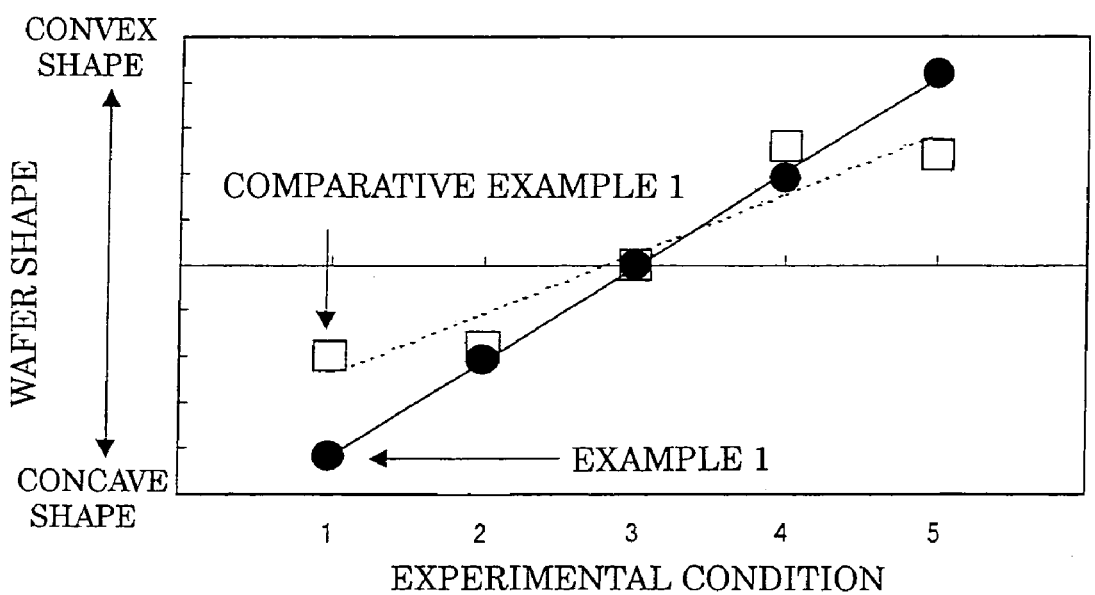
FIG. 6 illustrates a graph showing wafer shape responsiveness to changes in polishing conditions in example 1 and comparative example 1.

FIG. 6 shows evaluation results for responsiveness of wafer shape to changes in polishing conditions in example 1 and comparative example 1. The results are plotting of average values of five wafers (one batch) for each polishing condition. It is apparent as shown in FIG. 6 that example 1 exhibits good linearity (correlation coefficient: 0.997) and good responsiveness of wafer shape (that is, responsiveness of turn table deformation) to change in polishing condition. It is apparent that the comparative example exhibits poor and widely varying linearity (correlation coefficient: 0.898) and poor responsiveness.

As described above, the double-side polishing apparatus of the present invention provides good responsiveness of turn table deformation to change in polishing condition. Therefore, it is possible to perform polishing stably with high precision without deteriorating wafer shape, for example, by controlling turn table temperature in consideration of responsiveness of wafer shape (linearity) shown in FIG. 6 so as to compensate for variations in wafer shape arising as a result of continuous and repeated polishing with the same polishing pads.

EXAMPLE 2 AND COMPARATIVE EXAMPLE 2

Twenty batches of wafers were polished using the same double-side polishing apparatuses as were used in example 1 and comparative example 1.

Five silicon wafers having diameter of 300 mm (one batch) were inserted into respective wafer holding holes of the carrier plate (carrier plate having five wafer holding holes) so as to be rotatable. Each wafer was polished with pressed at a pressing force of 200 g/cm$^2$ by the upper and lower turn tables, to which soft non-woven cloths (polishing pads) were attached. The slurry used was that in which polishing abrasive grain consisting of colloidal silica of 0.05 μm in grain size was dispersed in alkali solution with pH 10.5. At this time, the polishing pads were continuously used without replacement for repeated polishing.

In the present experiment (example 2 and comparative example 2), 20 batches of wafers were polished while correcting change in wafer shape by adjusting the turn table temperature under a given condition every polishing of five batches using the temperature regulating means in the turn tables. Adjustment in every five batches was made under the same conditions in both example 2 and comparative example 2.

After polishing, the shapes of the obtained wafers were evaluated based on GBIR. GBIR (Global Back Ideal Range) is defined as margin between maximum and minimum positional displacements relative to a reference surface possessed in a wafer surface and is equivalent to TTV (Total Thickness Variation) that is a conventional and customary specification. In the present measurement, evaluation was conducted using a capacitance-type flatness measurement apparatus (AFS3220) made by ADE Corporation. At this time, relative variations were plotted, with GBIR of the first batch used as reference. Measurement results are shown in FIG. 7.

Figure 7:
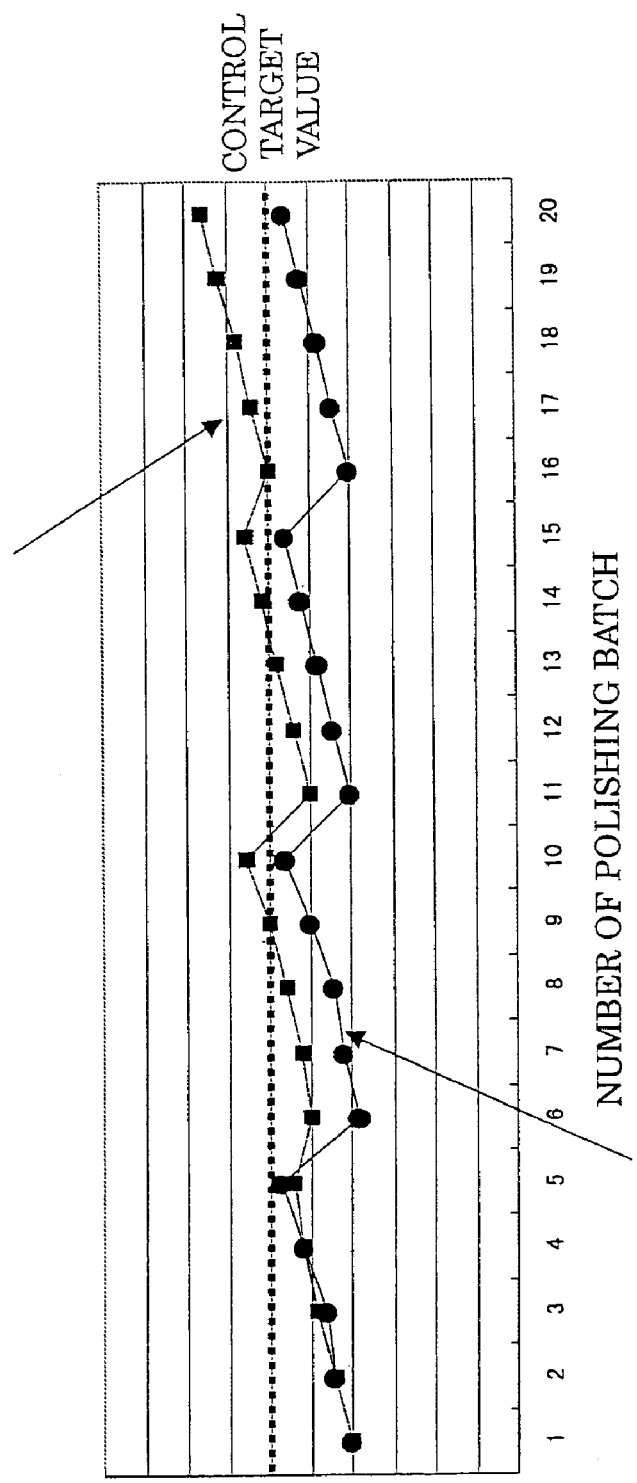
FIG. 7 illustrates a graph evaluating wafer shape controllability during repeated polishing of a plurality of batches of wafers in example 2 and comparative example 2.

In example 2, since the responsiveness of turn table deformation was improved as a result of use of the double-side polishing apparatus of the present invention as shown in FIG. 7, it was possible to control wafer shape within a given range through adjustment every five batches and maintain wafer shape within a range up to a control target value (a control upper limit) even in polishing of a plurality of batches of wafers. In comparative example 2, however, wafer shape was not improved to an anticipated shape despite adjustment every five batches under a given condition. Instead, wafer shape deteriorated with repeated polishing and was changed out of the control target value (the control upper limit). This was attributed to poor responsiveness of the turn table deformation that prevented correction to an anticipated shape.

EXAMPLE 3 AND COMPARATIVE EXAMPLE 3

Twenty batches of wafers were polished using the four-way double-side polishing apparatus as shown in FIG. 4 in which the PCD of upper turn table load supporting points and the PCD of carrier plate centers were both set to 800 mm (example 3). For comparison, twenty batches of wafers were polished using a conventional four-way double-side polishing apparatus in which the PCD of upper turn table load supporting points and the PCD of carrier plate centers were set respectively to 800 mm and 850 mm (comparative example 3).

A total of 15 silicon wafers having diameter of 300 mm (one batch) were inserted into three wafer holding holes formed on each of the five carrier plates. Each wafer was polished with pressed at a pressing force of 200 g/cm$^2$ by the upper and lower turn tables, to which soft non-woven cloths (polishing pads) were attached. The slurry used was that in which polishing abrasive grain consisting of colloidal silica of 0.05 μm in grain size was dispersed in alkali solution with pH 10.5. At this time, 20 batches of wafers were polished without replacement of the polishing pads while correcting change in wafer shape by adjusting the turn table temperature under a given condition every five batches using the temperature regulating means in the turn tables. Adjustment every five batches was made under the same conditions in both example 3 and and comparative example 3. After polishing, the shapes of the obtained wafers were evaluated based on GBIR. Relative variations were plotted, with GBIR of the first batch used as reference. Measurement results are shown in FIG. 8.

Figure 8:
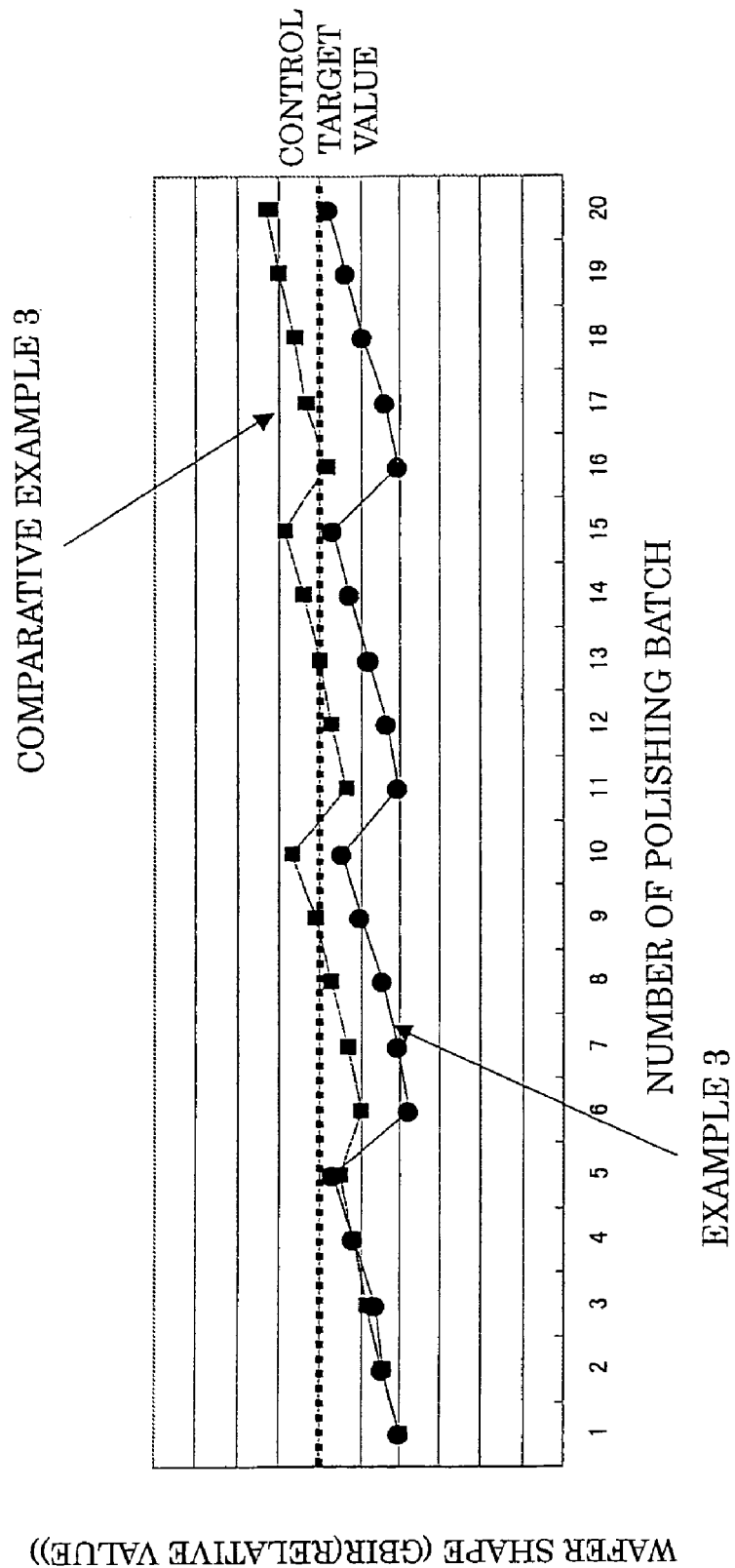
FIG. 8 illustrates a graph evaluating wafer shape controllability during repeated polishing of a plurality of batches of wafers in example 3 and comparative example 3.

In example 3, since the responsiveness of turn table deformation was improved as a result of use of the double-side polishing apparatus of the present invention as shown in FIG. 8, it was possible to control wafer shape within a given range through adjustment every five batches and maintain wafer shape within a range up to a control target value (a control upper limit) even in polishing of a plurality of batches of wafers. In comparative example 3, however, wafer shape was not improved to an anticipated shape despite adjustment every five batches. Instead, wafer shape deteriorated with repeated polishing and was changed out of the control target value (the control upper limit).

EXAMPLE 4

Twenty batches of silicon wafers were repeatedly polished while controlling the turn table shape through adjustment of slurry supply amount using a wafer double-side polishing apparatus as shown in FIG. 9 in which the PCD of upper turn table load supporting points and the PCD of centers of the wafer holding holes on the carrier plate (centers of wafers held by the carrier plate) were both set to 600 mm and in which the carrier plate performed a circular motion not accompanied by its rotation, with the average position of pitch circles formed by centers of wafer holding holes on the carrier plate coincident with the position of pitch circle formed by load supporting points of the upper turn table during polishing.

Five silicon wafers having diameter of 300 mm (one batch) were inserted into respective wafer holding holes of the carrier plate (carrier plate having five wafer holding holes) so as to be rotatable. Each wafer was pressed at a pressing force of 200 g/cm$^2$ by the upper and lower turn tables, to which soft non-woven cloths (polishing pads) were attached. The upper and lower turn tables were rotated on the rotational axis, with the carrier plate performing a circular motion not accompanied by its rotation, to polish the wafers. The slurry used was that in which polishing abrasive grain consisting of colloidal silica of 0.05 μm in grain size was dispersed in alkali solution with pH 10.5. The initial slurry supply amount was set to 4.0 liters/min.

Twenty batches of wafers were repeatedly polished without replacement of the polishing pads while correcting change in wafer shape by reducing slurry supply amount by 0.2 liters/min every polishing of five batches.

After polishing, the shapes of the obtained wafers were evaluated based on GBIR. GBIR (Global Back Ideal Range) is defined as margin between maximum and minimum positional displacements relative to a reference surface possessed in a wafer surface and is equivalent to TTV (Total Thickness Variation) that is a conventional and customary specification. In the present measurement, evaluation was conducted using a capacitance-type flatness measurement apparatus (AFS3220) made by ADE Corporation. Relative variations were plotted, with GBIR of the first batch used as reference. Measurement results are shown in FIG. 14.

Figure 14:
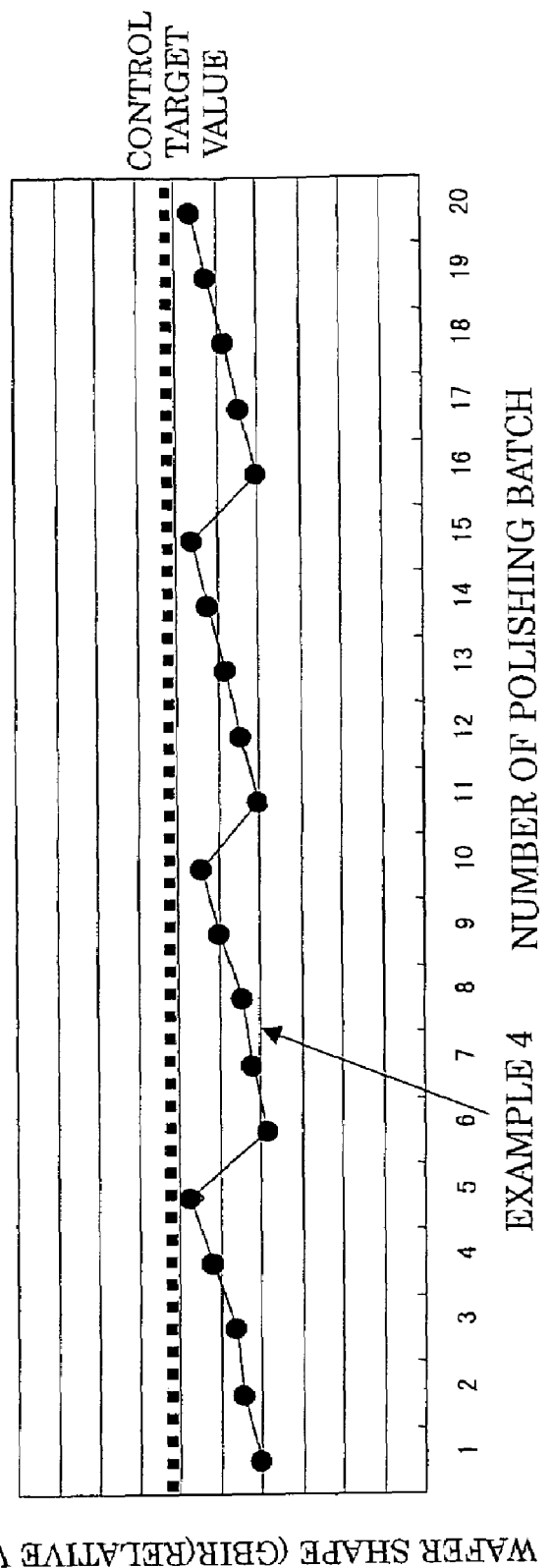
FIG. 14 illustrates a graph evaluating wafer shape controllability during repeated polishing of a plurality of batches of wafers in example 4.

In example 4, it was possible to control wafer shape within a given range through adjustment of slurry supply amount and maintain wafer shape within a range up to a control target value (a control upper limit) even in polishing of a plurality of batches of wafers as shown in FIG. 14.

EXAMPLE 5 AND COMPARATIVE EXAMPLE 4

Next, one batch of silicon wafers having diameter of 300 mm were polished using the same wafer double-side polishing apparatus as in example 4 in which water controlled at 25° C. was supplied to piping in the turn tables that was the temperature regulating means. Then, water temperature was raised to 40° C. by flowing hot water into the temperature regulating means in the turn tables for polishing of the next batch of silicon wafers. At this time, the shapes of two types of wafers were compared; one (example 5) polished through forcible deformation of the upper turn table into the state shown in FIG. 10B by adjusting the shape adjustment means constituted by the micrometers in accordance with change in turn table temperature and the other (comparative example 4) polished without using the shape adjustment means.

As a result, the shape of the wafer of example 5 polished through adjustment of the shape adjustment means under varying turn table temperatures was nearly the same as that of the wafers of the first batch polished with the turn table temperature set at 25° C. Thus, it was possible to control wafer shape during polishing, even in the case of substantial changes in polishing conditions such as turn table temperature, by adjusting the shape adjustment means provided in the upper turn table. By contrast, the wafer shape of comparative example 4, polished without using the shape adjustment means, was extremely convex.

EXAMPLE 6

Twenty batches of silicon wafers were repeatedly polished as example 6 while controlling the turn table shape through adjustment of slurry supply amount using a four-way wafer double-side polishing apparatus as shown in FIG. 11 in which the PCD of upper turn table load supporting points and the PCD of carrier plate centers were both set to 800 mm.

First, a total of 15 silicon wafers having diameter of 300 mm (one batch) were inserted into three wafer holding holes formed on each of the five carrier plates. Each wafer was polished with pressed at a pressing force of 200 g/cm$^2$ by the upper and lower turn tables, to which soft non-woven cloths (polishing pads) were attached. The slurry used was that in which polishing abrasive grain consisting of colloidal silica of 0.05 μm in grain size was dispersed in alkali solution with pH 10.5. The initial slurry supply amount was set to 5.0 liters/min. In example 6, twenty batches of wafers were repeatedly polished without replacement of the polishing pads while correcting change in wafer shape by reducing slurry supply amount by 0.2 liters/min every polishing of five batches.

After polishing, the shapes of the obtained wafer were evaluated based on GBIR. Relative variations were plotted, with GBIR of the first batch used as reference. Measurement results are shown in FIG. 15.

Figure 15:
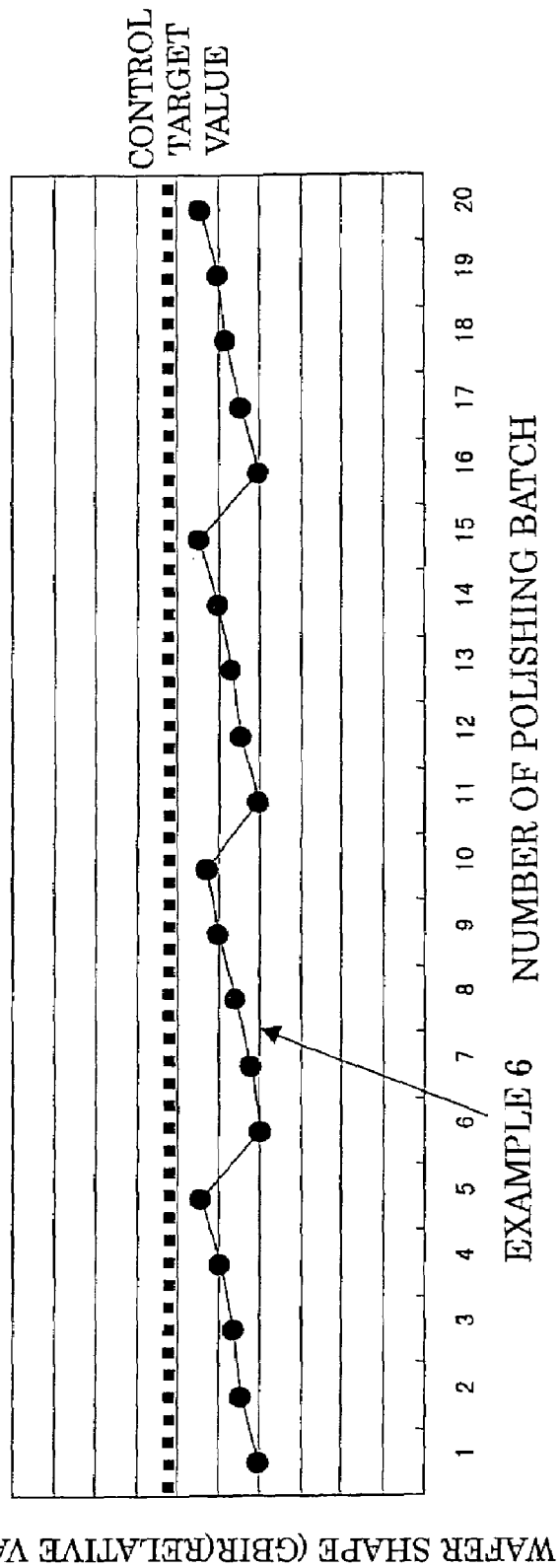
FIG. 15 illustrates a graph evaluating wafer shape controllability during repeated polishing of a plurality of batches of wafers in example 6.

In example 6, it was possible to control wafer shape within a given range through adjustment of slurry supply amount and maintain wafer shape within a range up to a control target value (a control upper limit) even in polishing of a plurality of batches of wafers as shown in FIG. 15.

EXAMPLE 7 AND COMPARATIVE EXAMPLE 5

Next, one batch of silicon wafers having diameter of 300 mm were polished using the same wafer double-side polishing apparatus as in example 6 with the temperature of the temperature regulating means in the turn tables controlled at 25° C. Then, the temperature of the temperature regulating means in the turn tables was raised to 40° C. for polishing of the next batch of silicon wafers. At this time, the shapes of two types of wafers were compared; one (example 7) polished through forcible deformation of the upper turn table shape into the state shown in FIG. 10B by adjusting the shape adjustment means constituted by the micrometers in accordance with change in turn table temperature and the other (comparative example 5) polished without using the shape adjustment means.

As a result, the shape of the wafer of example 7 polished through adjustment of the shape adjustment means under varying turn table temperatures was nearly the same as that of the wafers of the first batch polished with the turn table temperature set at 25° C. Thus, it was possible to control wafer shape during polishing, even in the case of substantial changes in polishing conditions such as turn table temperature, by adjusting the shape adjustment means provided in the upper turn table. By contrast, the wafer shape of comparative example 5, polished without using the shape adjustment means, was extremely convex.

The present invention is not limited to the embodiment described above. The above-described embodiment is a mere example, and those having substantially the same structure as that described in the appended claims and providing the similar functions and advantages are included in the scope of the present invention.

For example, while in the foregoing embodiment, a double-side polishing apparatus was shown in which the carrier plate performs a circular motion not accompanied by a rotation of the carrier plate as an example of the double-side polishing apparatus of the present invention, it should be borne in mind that the present invention is not limited thereto and any other double-side polishing apparatuses with any type of carrier plate motion are acceptable as long as the carrier plate motion allows uniform polishing of wafers.

While unevenness in wafers was evaluated in the foregoing examples as parameters representing wafer shape, other qualities are also acceptable. Responsiveness of the turn table shape to control can be improved by causing the PCD of upper turn table load supporting points and the average PCD of centers of wafers held by the carrier plate (the PCD of carrier plate centers in the case of a four-way double-side polishing apparatus) to coincide with each other, and any wafer qualities can facilitate control as long as such qualities are affected by the turn table shape.

It should be understood that while the examples were described herein by citing, as examples, double-side polishing apparatuses for polishing wafers having diameter of 300 mm, the present invention is not limited thereto and applicable also to double-side polishing apparatuses for polishing wafers having diameter of 200 mm or other diameters. It should also be appreciated that the number of wafer holding holes formed on the carrier plate is not particularly limited and that an arbitrary number of holes such as three, five or seven, may be formed.

The invention claimed is:

1. A wafer double-side polishing apparatus comprising:
a carrier plate having wafer holding holes, a center of each wafer holding hole disposed along a first pitch circle having a first diameter;
upper and lower turn tables to which polishing pads are attached; and
a slurry supply means;
wherein:
with wafers held in the wafer holding holes, the carrier plate being moved between the upper and lower turn tables while supplying slurry, to simultaneously polish both front and back surfaces of wafers;
the upper turn table further comprising a plurality of devices for fixing the upper turn table to support, the fixing devices load supporting points forming disposed along a second pitch circle having a second diameter equal to the first diameter, the load supporting points configured to receive and distribute applied force to the upper turn table;
the lower turn table further comprising a plurality of bearing devices forming load supporting points disposed along a third pitch circle having a third diameter equal to the first diameter, the load supporting points configured to receive and distribute applied force to the lower turn table.

2. The wafer double-side polishing apparatus according to claim 1, wherein the motion of the carrier plate is a circular motion not accompanied by rotation of the carrier plate.

3. A wafer double-side polishing method comprising:
holding wafers on a carrier plate having wafer holding holes for holding wafers, a center of each wafer holding hole disposed along a first pitch circle having a first diameter; and
moving the carrier plate between upper and lower turn tables to which polishing pads are attached, while supplying slurry, to simultaneously polish both front and back surfaces of the wafers;
wherein:
the upper turn table further comprising a plurality of devices for fixing the upper turn table to a support, the fixing devices forming load supporting points disposed along a second pitch circle having a second diameter equal to the first diameter, the load supporting points configured to receive and distribute applied force to the upper turn table;
the lower turn table further comprising a plurality of bearing devices forming load supporting points disposed along a third pitch circle having a third diameter equal to the first diameter, the load supporting points configured to receive and distribute applied force to the lower turn table; and
the wafers are polished while applying force to the load supporting points of the upper turn table and while applying force to the load supporting points of the lower turn table.

4. The wafer double-side polishing method according to claim 3, wherein the motion of the carrier plate is a circular motion not accompanied by rotation of the carrier plate.

5. The wafer double-side polishing method according to claim 3, wherein during the wafer polishing, the wafers are polished while controlling polishing conditions.

6. The wafer double-side polishing method according to claim 5, wherein the polishing condition control is performed by controlling the temperature of the upper turn table and/or the lower turn table.

7. The wafer double-side polishing method according to claim 1, wherein: the bearing devices are thrust bearings.

8. The wafer double-side polishing method according to claim 3, wherein: the bearing devices are thrust bearings.

* * * * *

UNITED STATES PATENT AND TRADEMARK OFFICE
CERTIFICATE OF CORRECTION

PATENT NO. : 7,364,495 B2  Page 1 of 1
APPLICATION NO. : 10/500278
DATED : April 29, 2008
INVENTOR(S) : Hiroyoshi Tominaga and Toshiyuki Hayashi It is certified that error appears in the above-identified patent and that said Letters Patent is hereby corrected as shown below:

Title page
Item (73) Assignee, "Etsu Handotai Co., Ltd." should read as follows: --Shin Etsu Handotai Co., Ltd.--

Signed and Sealed this

Second Day of June, 2009

JOHN DOLL
*Acting Director of the United States Patent and Trademark Office*